(12) United States Patent
Tamaki

(10) Patent No.: US 7,741,725 B2
(45) Date of Patent: Jun. 22, 2010

(54) SEMICONDUCTOR APPARATUS AND METHOD OF PRODUCING THE SAME

(75) Inventor: Kazuo Tamaki, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 328 days.

(21) Appl. No.: 11/854,192

(22) Filed: Sep. 12, 2007

(65) Prior Publication Data
US 2008/0067699 A1 Mar. 20, 2008

(30) Foreign Application Priority Data
Sep. 20, 2006 (JP) .............................. 2006-255018

(51) Int. Cl.
*H01L 23/28* (2006.01)
(52) U.S. Cl. ..................... 257/787; 438/126; 438/127; 257/E21.502; 257/E23.116
(58) Field of Classification Search ................. 438/126, 438/127; 257/787, E21.502, E23.116
See application file for complete search history.

(56) References Cited

U.S. PATENT DOCUMENTS 5,067,008 A * 11/1991 Yanaka et al. ............... 257/703
5,461,256 A * 10/1995 Yamada et al. .............. 257/679
6,365,979 B1 4/2002 Miyajima

FOREIGN PATENT DOCUMENTS

| JP | 1-165495 A | 6/1989 |
|---|---|---|
| JP | 5-160064 A | 6/1993 |
| JP | 2002-237551 A | 8/2002 |

\* cited by examiner

*Primary Examiner*—Trung Dang
(74) *Attorney, Agent, or Firm*—Nixon & Vanderhye, P.C.

(57) ABSTRACT

With a semiconductor apparatus package of example embodiments of the technology disclosed herein and a method of producing the semiconductor apparatus package, the semiconductor apparatus package includes a circuit board and a semiconductor device sealed with sealing resin. The circuit board has a groove in a section of a surface of the circuit board. The section is outside of the resin sealing section, and the surface includes the resin sealing section. The groove is at least partially filled with sealing resin having seeped from a resin sealing section. Thus, in the semiconductor apparatus package including the circuit board, which is exposed from the resin sealing section, and the semiconductor device sealed on the circuit board with the sealing resin, the spread of a thin resin film onto that exposed circuit board resulting from seepage of resin sealing the semiconductor device is prevented.

18 Claims, 17 Drawing Sheets

SEMICONDUCTOR APPARATUS AND METHOD OF PRODUCING THE SAME

This Nonprovisional application claims priority under 35 U.S.C. §119(a) on Patent Application No. 255018/2006 filed in Japan on Sep. 20, 2006, the entire contents of which are hereby incorporated by reference.

FIELD OF THE INVENTION

The present invention relates to a semiconductor apparatus package and a method of producing the semiconductor apparatus package, which semiconductor apparatus package is to be used in semiconductor apparatuses that can be mounted at high density. Particularly, the present invention relates to a semiconductor apparatus package, and a method of producing the semiconductor apparatus package, including a land on a circuit board that is partially exposed outwardly from a resin sealing section of a semiconductor device.

BACKGROUND

Portable information equipments have become smaller and lighter. This has necessitated high density mounting of semiconductor apparatuses. In response to this need, semiconductor apparatuses that can be mounted at high density, such as CSP (Chip Size Package) and BGA (Ball Grid Array), have been employed in recent years.

A method of producing the semiconductor apparatuses includes the following plural steps: mounting a semiconductor device on a circuit board provided with a wiring layer; placing a mold on the outside of the semiconductor device; and pouring epoxy resin or the like into the mold to form a resin sealing layer so as to cover the semiconductor device.

In a common method of producing the semiconductor apparatus, a plurality of semiconductor apparatuses are formed at one time on a batch substrate through the foregoing processes, and then the batch substrate is cut so as to be diced into individual pieces of semiconductor apparatuses.

Further, there is a structure called POP (Package on Package), which allows higher density mounting of semiconductor apparatuses. Specifically, semiconductor apparatus packages are stacked so that higher density and systematization are achieved.

FIG. 19 is a sectional view showing an exemplary POP structure.

For example, an upper package of a memory package is stacked on a lower package of a logic package so that higher density and systematization are realized.

In order to do so, a lower semiconductor apparatus package 2 (this package will be referred to as "lower package 2" hereinafter) needs to include a stacking pad 3, constituted of a land provided on a circuit board, for an upper semiconductor apparatus package 1 (this package will be referred to as "upper package 1" hereinafter) to be mounted.

The upper package 1 and the lower package 2 are electrically connected by the stacking pad 3 of the lower package 2 and a connecting bump 27 of the upper package 1.

Further, a surface of the lower package 2, on which surface a semiconductor device is mounted, is roughly divided into two sections: a section where the semiconductor device mounted on the substrate is sealed with resin (this section will be referred to as "resin sealing section 28" hereinafter); and a section where the substrate that is not sealed with the resin is exposed (this section will be referred to as "exposed section 29" hereinafter).

Normally, the stacking pad 3 provided to the lower package 2 is formed outside of the resin sealing section 28 of the semiconductor apparatus.

The following are two possible positional relationships between the resin sealing section 28 and the stacking pad 3.

FIGS. 20 and 21 are sets of a plan view and a sectional view showing a positional relationship between the resin sealing section and the stacking pad 3 in the lower package 2.

In FIG. 20, the resin sealing section, where the semiconductor apparatus is sealed with the sealing resin 4, is formed at the center of the circuit board, and the stacking pad 3 is provided so as to surround the semiconductor apparatus along a periphery of the resin sealing section.

In FIG. 21, the circuit board is divided into three stripe zones The central zone is the section of the sealing resin 4 with which the semiconductor device is sealed. The stacking pad 3 is provided in each of the side zones.

When the resin sealing sections of the semiconductor apparatus packages shown in FIGS. 20 and 21 are formed by molding, the sealing resin 4 seeps over the circuit board through a gap between the mold and the circuit board. In this case, a thin insulating material called a thin resin film 5 of resin is formed outside of an edge of an original resin sealing section (this edge will be referred to as "sealing-resin edge" hereinafter).

In FIGS. 20 and 21, the lower packages 2 and 31 of the POP structure, in which semiconductor apparatus packages are stacked, are shown.

If the upper package is stacked with the thin resin film 5 covering the stacking pad 3, electrical connection between the upper package 1 (see FIG. 19) and the lower packages 2 and 31 becomes poor.

In view of the problems of the thin resin film, Japanese Unexamined Patent Publication No. 317472/1999 (Tokukaihei 11-317472) (publication date: Nov. 16, 1999) suggests not a POP structure but the method for preventing the thin resin film 5. Specifically, as shown in FIG. 22, the method includes forming the protrusion 25 on the circuit board with the use of insulating material such as solder resist, and pressing the mold against the protrusion 25 to eliminate gaps.

FIG. 22 is a sectional view showing a semiconductor apparatus produced so as to have the protrusion 25 to prevent the thin resin film.

There are, however, the following problems with the method in which the protrusion 25 is formed on the circuit board to prevent the thin resin film 5.

(1) In the case of the semiconductor apparatus package including the stacking pad 3 as shown in FIGS. 20 and 21, the edge of the mold needs to be positioned in between the stacking pad 3 and the protrusion 25 (see FIG. 22). It is, however, difficult especially in the case of high-density semiconductor apparatus package (the space between the stacking pad 3 and the protrusion 25 is narrow) to produce the semiconductor apparatus in such a manner as to form the protrusion 25 inside of the mold as shown in FIG. 22, because the position of the sealing-resin edge varies owing to a tolerance of the circuit board.

Therefore, with the semiconductor apparatus package, such as the POP structure, including the resin sealing section and the section where the land is provided on the substrate exposed from the resin sealing section, it is not possible to form the protrusion for preventing the seepage of the resin from the resin sealing section. This raises the problem of poor electrical connection resulting from the thin resin film seeping and covering the land section on the substrate that is exposed.

The problem is not the presence of the thin resin film, which is formed of the sealing resin having seeped from the resin sealing section, but the fact that the sealing resin having seeped covers the land on the substrate exposed from the resin sealing section.

(2) Further, with regard to the method of producing the semiconductor apparatus package, if the protrusion is to be formed with the use of insulating material such as solder resist, one additional photolithography process of applying solder resist to the substrate to form a film becomes necessary. This results in increase of production costs.

It is thus necessary to establish a way to produce the semiconductor apparatus package, by which the thin resin film having seeped from the resin sealing section is prevented from covering the land on the substrate exposed, without an additional process.

Further, if the semiconductor apparatus package shown in FIG. 21 is to be produced by dicing the batch substrate into individual pieces, the following problems arise if the thin resin film is formed on the cutting lines.

FIG. 23 is a set of a plan view, a perspective view, and a sectional view showing the process of dicing the batch substrate into semiconductor apparatus packages.

As shown in FIG. 23, normally the surface sealed with resin is attached, and the batch substrate is cut from a rear surface of the package (surface on which the bump 15 is mounted), with a dicing blade 6 formed of a circular diamond grindstone for cutting the wafer at high-speed rotation.

In the process of cutting the batch substrate with the dicing blade 6, a strip of shred 7 (e.g. solder resist, wirings of the substrate) is produced easily owing to a situation in which the batch substrate is cut with nothing supporting the lower side, which is the front surface of the package and the surface sealed with resin (i.e. the lower side is in midair).

If no thin resin film 5 is on the cutting line of the batch substrate, the shred 7 is cut off from the substrate and drained away by water discharged with respect to sections having been cut. Thus, the shred 7 does not adhere to an outer edge of the package.

If, however, there is the thin resin film 5 on the solder resist on the cutting line when the batch substrate is cut, the thin resin film 5 peels off from the solder resist by the cutting load (downward), owing to weak adhesive force between the thin resin film 5 and the solder resist. Because the substrate is cut with nothing supporting the lower side, the thin resin film S thus peeled off falls toward the surface sealed with resin and the inside of the package. Thus, it is not possible to cut off the thin resin film 5, and the thin resin film 5 adheres to the outer edge of the package. This is a problem.

In the process of cutting the batch substrate, if the batch substrate is cut along A-A' while there is the thin resin film 5 formed of resin having seeped from the sealing-resin edge, the thin resin film 5 adheres to the outer edge of the package. This lets the shred 7 adhere to the outer edge of the semiconductor apparatus package, as shown in the figure.

FIG. 24 shows the shred 7 adhering to the circuit board that is diced. As shown in this figure, the thin resin film 5 that is not cut off on the cutting line of the batch substrate protrudes from the outer edge of the circuit board, and the shred 7 adheres to the thin resin film 5 thus protruded.

In the worst cases, the shred 7 thus adhered may cause poor connection in the electrical connection using the land in the semiconductor apparatus package including the substrate having the land in the exposed section.

SUMMARY

The technology disclosed herein is in view of the foregoing problems, and has as an object to reduce the risk of poor connection in an electrical connection using a circuit board, which poor connection is caused if sealing resin having seeped from a resin sealing section at the time of sealing a semiconductor device with the sealing resin covers an exposed section of the circuit board that is in.

To solve the above problems, a semiconductor apparatus package of the technology disclosed herein is adapted so that the semiconductor apparatus package includes a circuit board, at least a part of which is exposed from a resin sealing section, and a semiconductor device sealed with resin, the semiconductor apparatus package having at least one groove in a section of a resin sealing surface of the circuit board, which section is outside of the resin sealing section, said at least one groove being at least partially filled with excess sealing resin having seeped from the resin sealing section.

With this structure, the sealing resin having seeped from the resin sealing section flows into the groove so that the circuit board exposed from the resin sealing section is prevented from being covered by the sealing resin having seeped.

Thus, the sealing resin having seeped does not form the thin resin film to cover the circuit board. This produces an advantage that poor connection in the electrical connection using the circuit board is prevented.

If the advantage is applied to the POP, formation of the thin resin film of resin entering a section where the land for stacking other semiconductor apparatus packages is provided is prevented. This produces an advantage that poor stacking of the upper semiconductor apparatus package and the lower semiconductor apparatus package is prevented.

A method of producing a semiconductor apparatus package in accordance with the technology disclosed herein is adapted so that the method of producing a semiconductor apparatus package including: a circuit board, at least a part of which is exposed from a resin sealing section, including an electrical connection section; and a semiconductor device sealed with resin, includes the step of forming a groove, which is at least partially filled with excess sealing resin having seeped from the resin sealing section, by making an opening in an insulating layer formed on the circuit board, the step of forming the groove being carried out concurrently with the step of eliminating, in photolithography for forming the insulating layer on the circuit board, the insulating layer that is on the electrical connection section.

Normally, a wiring pattern and an electrical connection section such as terminals are provided on the circuit board exposed from the resin sealing section. The electrical connection section is to be connected to the wiring pattern, and is utilized to make electrical connections with other components. The insulating layer is formed with the wiring pattern being covered and the electrical connection section being exposed. To form the insulating layer, the photolithography is carried out.

Specifically, in the photolithography, material of the insulating layer, for example solder resist which is photosensitive material, is applied all over the front surface of the circuit board, a mask is placed on the electrical connection section, and then light is applied.

Thereafter, the solder resist in the section covered by the mask is eliminated during the process of development so that no insulating layer is formed on the electrical connection section.

In the process of photolithography, the solder resist in a section where the groove is to be formed is eliminated, that is to say, an opening is made in the insulating layer, concurrently with exposing the electrical connection section from the insulating layer, whereby the groove is formed. The solder resist in the section where the groove is to be formed may be eliminated completely to expose the front surface of the circuit board, or may be eliminated so as not to expose the front surface of the circuit board.

Thus, it becomes possible to form the groove concurrently with exposing the electrical connection section from the insulating layer in the process of photolithography. This produces an advantage that no additional process for forming the groove is necessary A method of producing a semiconductor apparatus package in accordance with the technology disclosed herein is adapted so that the method of producing a semiconductor apparatus package including a circuit board, at least a part of which is exposed from a resin sealing section, and a semiconductor device sealed with resin, includes the steps of: forming plural pieces of the semiconductor apparatus packages by use of a batch substrate; cutting the batch substrate to divide the plural pieces of the semiconductor apparatus packages into individual semiconductor apparatus packages; forming the groove, into which excess sealing resin having seeped from the resin sealing section is to flow, by making an opening in an insulating layer, which covers a front surface of the circuit board, to expose the front surface of the circuit board, the groove being formed in such a manner that at least a part of the groove overlaps a cutting line of the batch substrate and is formed at a spot on the cutting line, to which spot the excess sealing resin flows; and cutting the batch substrate along the cutting line.

As the foregoing describes, the groove to be filled with the excess sealing resin having seeped from the resin sealing section is formed by making the opening in the insulating layer so as to expose the front surface of the circuit board. Thus, the thin resin film formed of the sealing resin having filled the groove is in direct contact with the base material of the circuit board.

Further, the groove is formed at a spot where the excess sealing resin flows onto the cutting line, in such a manner that at least a part of the groove is formed so as to overlap the cutting line of the batch substrate. Thus, the sealing resin having entered the groove flows along the front surface of the circuit board that is exposed, and flows onto the cutting line.

As already described, even if the circuit board is cut along the cutting line, the thin resin film keeps adhering to the front surface of the circuit board. Thus, the problems due to weak adhesive force between the insulating layer and the thin resin film are prevented. Specifically, the following problems are prevented as a result of the cutting, the thin resin film peels off and falls onto the surface sealed with resin, making it impossible to cut the thin resin film and causing the thin resin film to adhere to the outer edge of the package; and shreds of the insulating layer or the like adhere to the outer edge of the semiconductor apparatus package and to the dicing blade, resulting from the thin resin film adhering to the outer edge of the package. This produces an advantage that the risk of poor electrical connection in the semiconductor apparatus package is reduced.

A method of producing a semiconductor apparatus package in accordance with the technology disclosed herein is adapted so that the method of producing a semiconductor apparatus package including a circuit board, at least a part of which is exposed from a resin sealing section, and a semiconductor device sealed with resin, includes the steps of: forming plural pieces of the semiconductor apparatus packages by use of a batch substrate; cutting the batch substrate to divide the plural pieces of the semiconductor apparatus packages into individual semiconductor apparatus packages; forming at least one groove, into which excess sealing resin having seeped from the resin sealing section is to flow, in a section of a resin sealing surface of the circuit board, which section is outside of the resin sealing section; and cutting, prior to step of cutting the batch substrate, excess sealing resin having seeped from the resin sealing section onto the cutting line, along the cutting line by use of laser.

With this feature, at the time of cutting the batch substrate with the dicing blade or the like, the thin resin film on the cutting line is already cut by laser. This produces an advantage that the thin resin film does not fall to the surface sealed with resin to adhere, as a cutting defect, to the outer edge of the package.

Thus, shreds are prevented from adhering to the outer edge of the package and to the dicing blade, resulting from the thin resin film adhering to the outer edge of the package. Therefore, the risk of poor electrical connection in the semiconductor apparatus package is reduced.

Additional objects, features, and strengths of the technology disclosed herein will be made clear by the description below. Further, the advantages of the technology disclosed herein will be evident from the following explanation in reference to the drawings.

BRIEF DESCRIPTION OF THE DRAWINGS

FIG. 8(a) is a plan view showing a circuit board constituting the semiconductor apparatus of an example Embodiment 2.

FIG. 8(*c*) is a sectional view showing the circuit board constituting the semiconductor apparatus of example Embodiment 2.

FIG. 17(*b*) is a perspective view showing another example structure of the semiconductor apparatus of example Embodiment 4.

DESCRIPTION OF THE EMBODIMENTS

Figure 1:
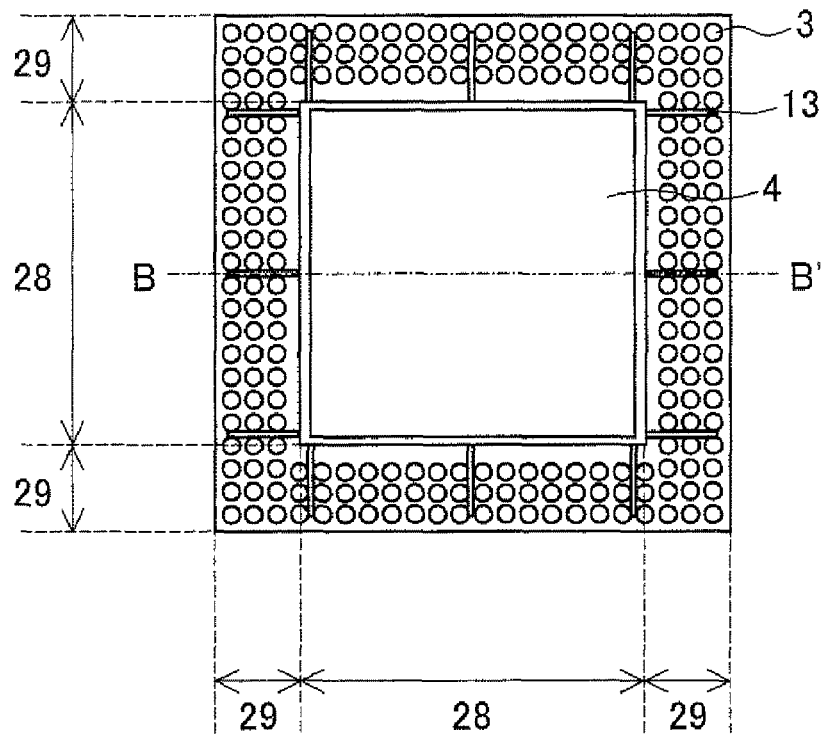
FIG. 1(a) is a plan view showing a structure of a semiconductor apparatus of an example Embodiment 1.
FIG. 1(b) is a sectional view showing the structure of the semiconductor apparatus of an example Embodiment 1.
Figure 1:
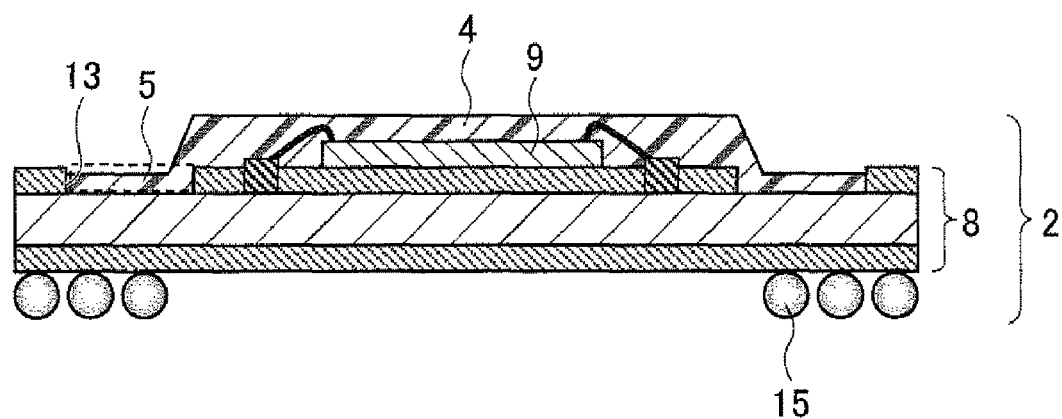
Figure 16:
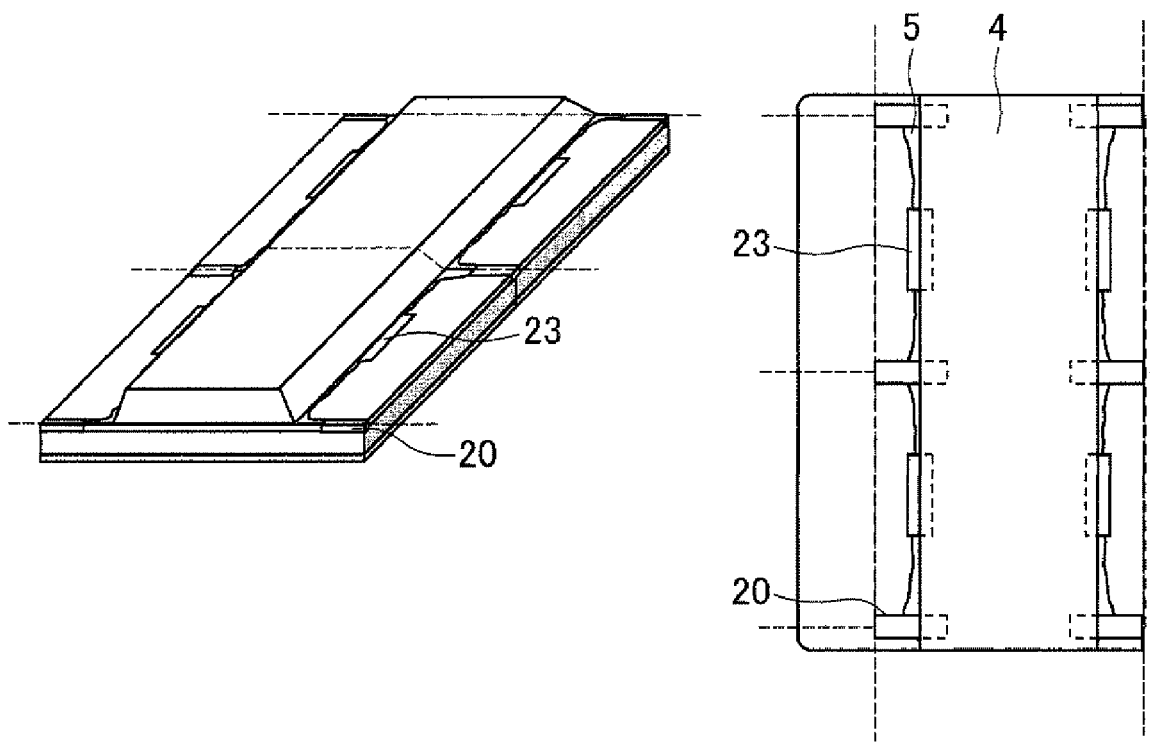
FIG. 16 is a set of a perspective view and a plan view showing an example structure of the semiconductor apparatus of example Embodiment 3.
Figure 18:
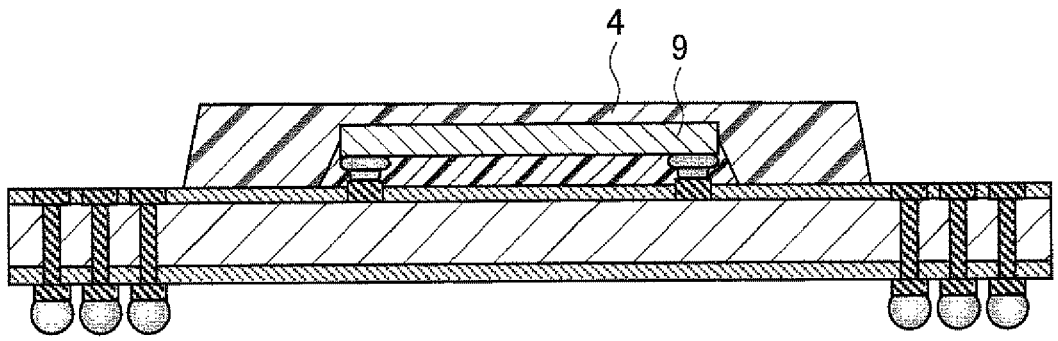
FIG. 18 is a sectional view showing example structures of the semiconductor apparatus of example Embodiments 1 and 2 in which a semiconductor device is mounted on a substrate by flip-chip bonding.
Figure 19:
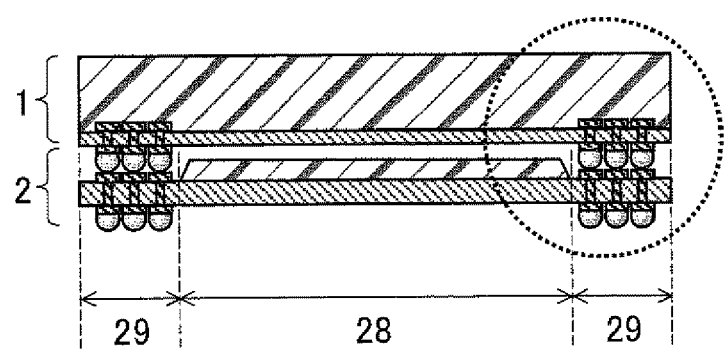
FIG. 19 is a set of sectional views showing a structure of a semiconductor apparatus of POP, which is a conventional technique.
Figure 19:
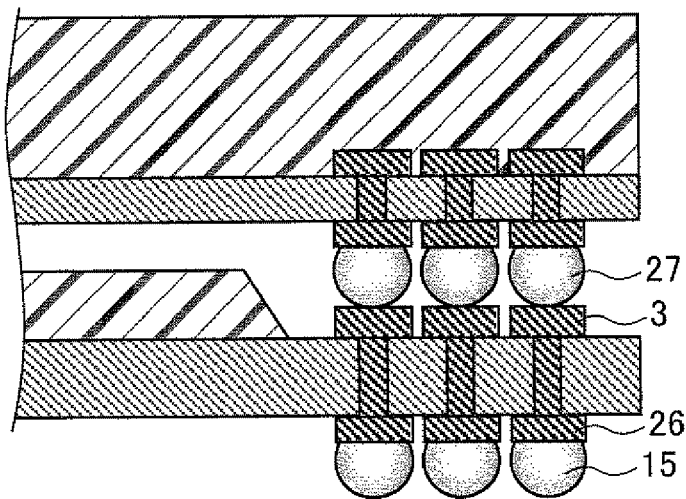
Figure 20:
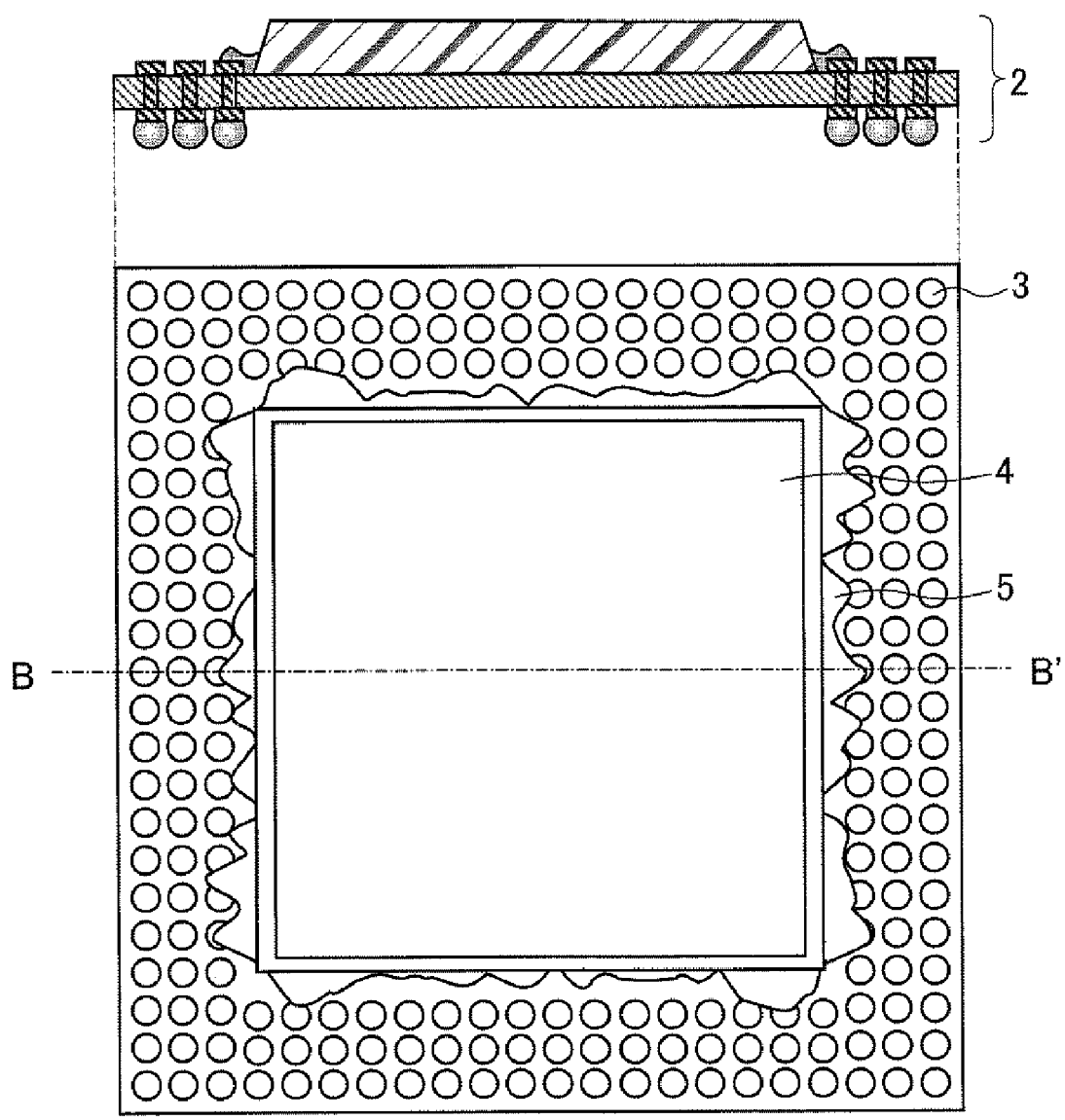
FIG. 20 is a set of a plan view and a sectional view showing a semiconductor apparatus of a conventional technique, in which there is a thin resin film.
Figure 21:
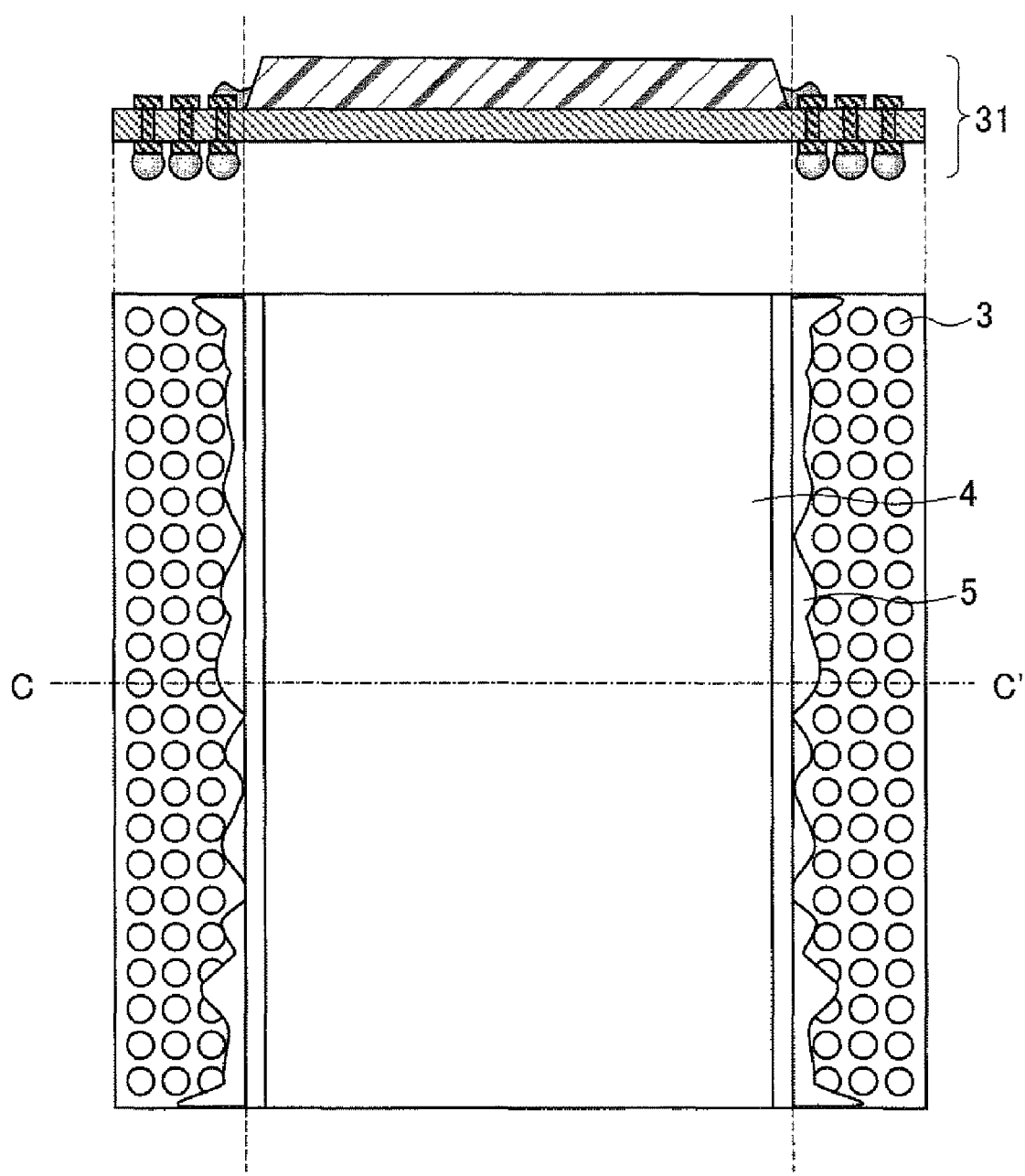
FIG. 21 is a set of a plan view and a sectional view showing a semiconductor apparatus of a conventional technique, in which there is a thin resin film.
Figure 22:
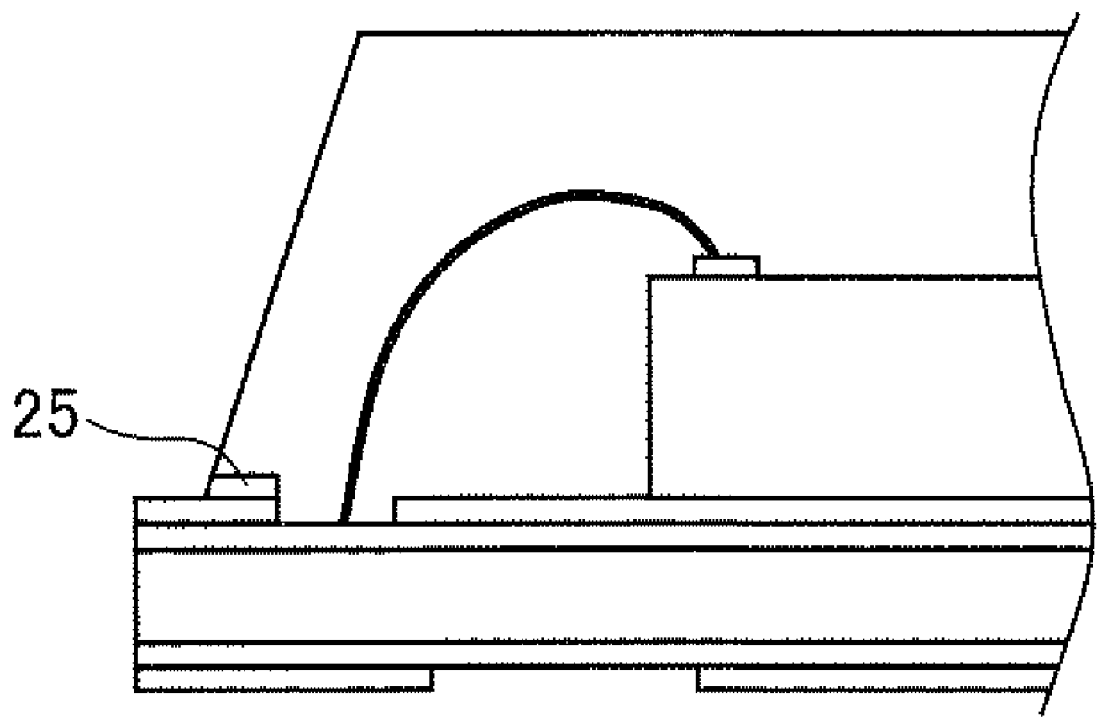
FIG. 22 is a sectional view showing a structure of a semiconductor apparatus of a conventional technique having a protrusion.

FIGS. 1(*a*) and 1(*b*) to FIG. 16, and FIG. 18 are plan views and sectional views showing exemplary structures of a semiconductor in accordance with example embodiments of the technology disclosed herein.

Embodiment 1

FIG. 1(*a*) is a plan view showing a structure of a semiconductor apparatus package of Embodiment 1 of the present invention. FIG. 1(*b*) is a sectional view taken along B-B' indicated in FIG. 1(*a*).

The semiconductor apparatus package shown in those figures is a lower semiconductor apparatus package 2 (this package will be referred to as "lower package 2" hereinafter) of a POP structure. The lower package 2 includes a stacking pad 3 (this pad corresponds to an electrical connection section defined in the Claims, and is sometimes referred to as "land") for stacking the upper semiconductor apparatus package A resin sealing section 28, in which a semiconductor device 9 is sealed with sealing resin 4, is formed at the center of a circuit board 8 of the lower package 2. An exposed section 29, where the stacking pad 3 is to be provided, is formed along a periphery of the resin sealing section 28 so as to surround the semiconductor device 9.

In those figure, at least one groove 13, which is to be partially filled with excess sealing resin 4 having seeped from the resin sealing section 28, is formed in a surface of the circuit board outside of the resin sealing section 28, which surface is sealed with resin. Specifically, the groove 13 is formed so as to extend from the vicinity of the resin sealing section 28 toward the exposed section 29, allowing the sealing resin 4 having seeped from the resin sealing section 28 to flow into the groove 13. The structure of the groove 13 and the method of forming the groove 13 will be described later.

The number of groove(s) 13 to be formed is not particularly limited, but it is preferable that a total capacity of the groove(s) 13 be higher than an amount of seeped sealing resin 4. Further, it is preferable that plural grooves 13 be equally formed in the section around the resin sealing section 28, that is, the exposed section 29. For example in the case of FIG. 1(*a*), three grooves 13 are formed per side of the resin sealing section 28, which is substantially square-shaped, and are equally spaced, whereby a total of 12 grooves 13 are provided isotropically.

It is preferable that at least a part of the groove 13 be contiguous to the resin sealing section 28 and to the circuit board 8 exposed from the resin sealing section 28, that is to say, a sealing-resin edge that is a boundary between the resin sealing section 28 and the exposed section 29. A part of the groove 13 may extend beyond the sealing-resin edge and to the inside of the resin sealing section 28. As such, the sealing resin 4 having seeped from the resin sealing section 28 flows into the groove 13 more assuredly.

The sealing resin 4 having seeped from the resin sealing section 28 flows into the groove 13 so that the excess sealing resin 4 is prevented from entering the exposed section 29, forming the thin resin film 5, and covering the stacking pad 3, in the lower package 2 shown in FIGS. 1(*a*) and 1(*b*). Thus, the electrical connection using the stacking pad 3 does not become poor.

Figure 3:
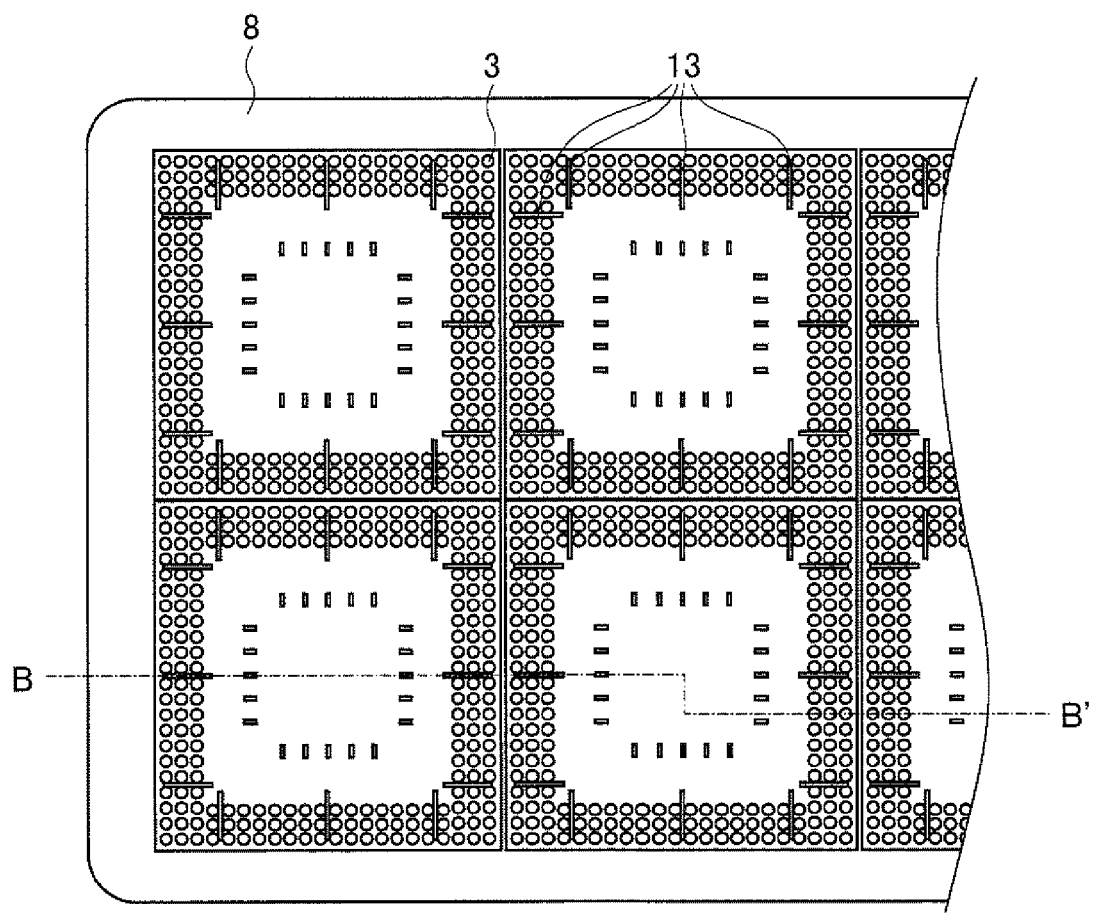
FIG. 3(a) is a plan view showing a circuit board constituting the semiconductor apparatus of example Embodiment 1.
FIG. 3(b) is a sectional view showing the circuit board constituting the semiconductor apparatus of example Embodiment 1.
FIG. 3(c) is a sectional view showing the circuit board constituting the semiconductor apparatus of example Embodiment 1.
Figure 3:
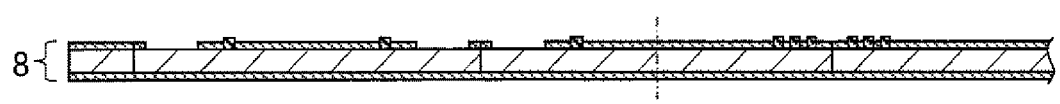
Figure 3:
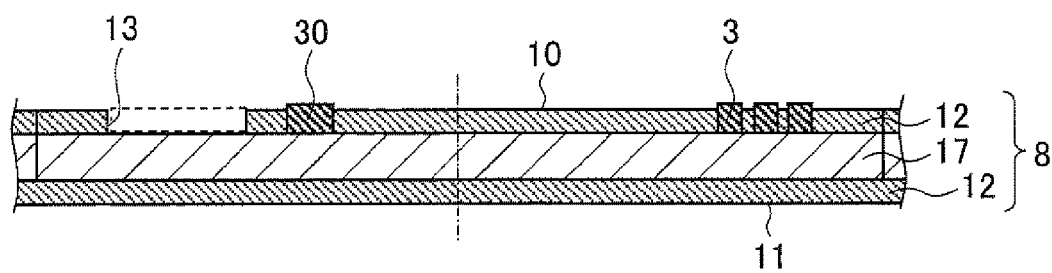

The following describes in detail the structure of the groove 13, with reference to FIGS. 3(*a*), 3(*b*), and 3(*c*).

FIG. 3(*a*) is a plan view of the circuit board 8 constituted of the batch substrate, taken from a side on which the semiconductor device 9 (see FIG. 1(*b*)) is to be mounted. FIG. 3(*b*) is a sectional view of the circuit board 8 taken along B-B'. FIG. 3(*c*) is a sectional view showing an enlarged view of FIG. 3(*b*).

As shown in FIG. 3(*a*), the stacking pad 3 and the groove 13 are formed on a surface of the circuit board 8, on which surface the semiconductor device 9 is to be mounted.

Further, as shown in FIG. 3(c), the surface (resin sealing surface) of the circuit board 8, on which surface the semiconductor device 9 is to be mounted, is a first surface 10 of the circuit board, and a surface of the circuit board 8, on which surface the bump 15 for external connection (see FIG. 1(b)) is to be mounted, is a second surface 11 of the circuit board. A film of solder resist 12 (this resist corresponds to an insulating layer defined in the Claims) is formed on each of the surfaces 10 and 11 of the circuit board 8 to serve as insulating layers. The groove 13 is formed in the first surface 10, on which the semiconductor device 9 is to be mounted.

The groove 13 is formed by making an opening in the solder resist 12 formed on the first surface 10 of the circuit board. It is preferable that the groove 13 be formed by making an opening in the solder resist 12 in such a manner that the front surface of the base material 17 of the circuit board 8 is exposed.

The groove 13 is formed by making the opening in the solder resist 12 in such a manner that the front surface of the base material 17 of the circuit board 8 is exposed. Thus, the sealing resin 4 having seeped from the resin sealing section 28 and flowed into the groove 13 comes into direct contact with the base material 17 of the circuit board.

The adhesive force between the sealing resin 4 and the base material 17 is greater than that between the sealing resin 4 and the solder resist 12. Thus, the sealing resin 4 flowed into the groove 13 does not easily peel off from the circuit board 8.

As a result that the opening is made in the solder resist 12, there is formed a difference in level, by the thickness of the solder resist 12, between the section where the film of the solder resist 12 is formed and the section where no solder resist 12 exists. The groove 13 is formed through the use of the difference in level.

The following describes an exemplary production method to realize the semiconductor apparatus package shown in FIGS. 1(a) and 1(b), with reference to FIGS. 3(a), 3(b), 3(c) to FIG. 7.

Plural semiconductor devices 9 are mountable on the circuit board 8 shown in FIGS. 3(a), 3(b), and 3(c). Plural semiconductor apparatuses are formed on the batch substrate at the same time, and then the circuit board 8 is cut at the end so as to be diced into individual pieces of semiconductor apparatuses, whereby plural pieces of semiconductor apparatus packages are produced.

The opening is formed in the solder resist 12 by the following process of photolithography.

In the process of photolithography for forming the film of the solder resist 12 on the circuit board 8, the solder resist 12, which is photosensitive material, is applied all over the front surface of the circuit board 8, a mask is placed on the stacking pad 3 and on the connecting pad 30 (a pad that is provided on the circuit board 8 to electrically connect the semiconductor apparatus 9 and the thin metal wire 14), and then light is applied to the circuit board 8. The stacking pad 3 and the connecting pad 30 correspond to the electrical connection section defined in the Claims.

Thereafter, the solder resist 12 in the section covered by the mask is eliminated in the process of development. As a result, the opening is formed in the solder resist 12 at the sections where the connecting pad 30 and the stacking pad 3 are to be formed, so that no film of the solder resist 12 is formed in the sections.

The solder resist 12 applied to the section where the groove 13 is to be formed is eliminated concurrently with eliminating, in the photolithography, the solder resist 12 applied to the sections where the connecting pad 30 and the stacking pad 3 are to be formed.

Thus, no film of the solder resist 12 is formed in the section where the groove 13 is to be formed. As a result, the groove 13 is formed in the circuit board 8.

Accordingly, it is possible to form the groove 13 concurrently with eliminating, in the photolithography, the solder resist 12 applied to the connecting pad 30 and to the stacking pad 3. Therefore, neither the number of production processes nor the amount of production costs increases.

Figure 4:
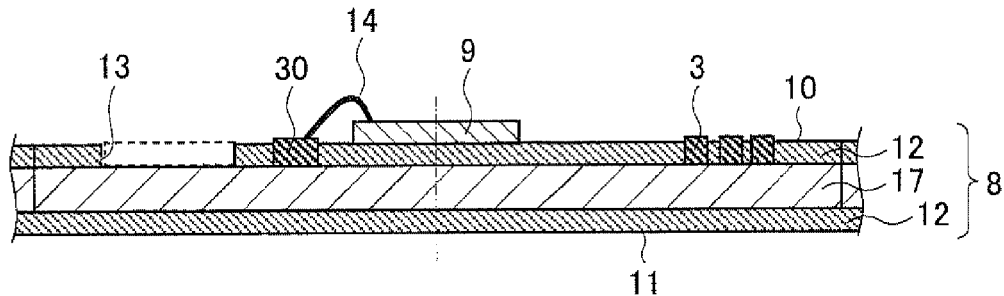
FIG. 4 is a sectional view showing a structure of the semiconductor apparatus of example Embodiment 1 during a production process.

Thereafter, as shown in FIG. 4, the semiconductor device 9 is mounted on the circuit board 8, and an electrode of the semiconductor device 9 and the connecting pad 30 of the circuit board 8 are connected by the thin metal wire 14.

The method of connecting the electrode of the semiconductor device 9 and the connecting pad 30 of the circuit board 8 is not limited to the foregoing method. As shown in FIG. 18, flip-chip bonding may be employed in which a bump mounted on the semiconductor device 9 and a corresponding land of the substrate are bonded without using a thin metal wire.

Figure 5:
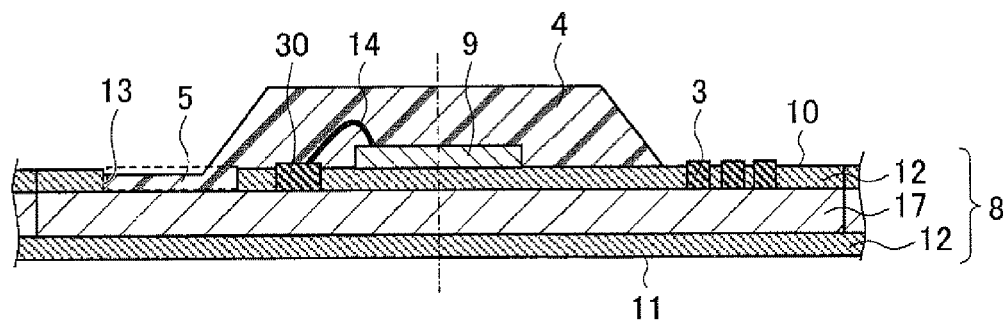
FIG. 5 is a sectional view showing a structure of the semiconductor apparatus of example Embodiment 1 during a following production process.

Then, the semiconductor apparatus 9 is sealed with the sealing resin 4, as shown in FIG. 5.

The semiconductor device 9 is sealed with resin by, for example, transfer molding with the use of a mold of a top gate design.

The resin sealing section 28 (see FIG. 1) is arranged so as not to cover the stacking pad 3.

As shown in this figure, the sealing resin 4 having seeped from the edge of the resin sealing section 28 (this edge will be referred to as "sealing-resin edge" hereinafter) flows into the groove 13. This prevents the spread of the thin resin film 5 to the stacking pad 3, and therefore stacking properties of the POP structure are not deteriorated.

Figure 6:
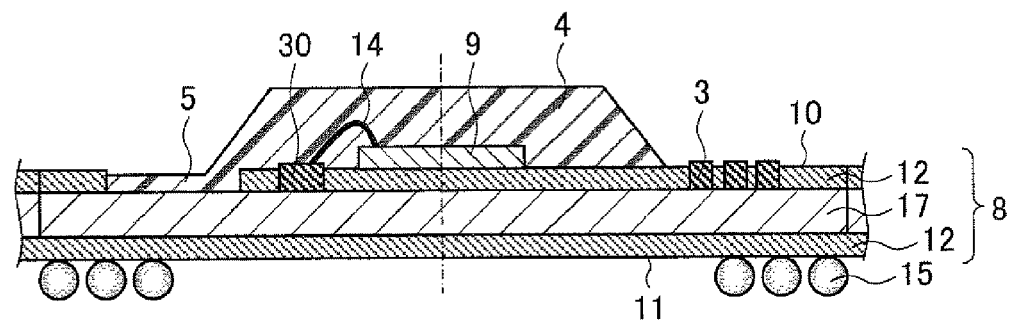
FIG. 6 is a sectional view showing a structure of the semiconductor apparatus of example Embodiment 1 during a following production process.

Then, as shown in FIG. 6, the bump 15 is formed on a pad (not illustrated) for external terminals, which pad is formed on the second surface 11 of the circuit board 8.

The bump 15 is electrically connected to the electrode of the semiconductor apparatus 9 mounted on the first surface 10 of the circuit board 8.

Figure 7:
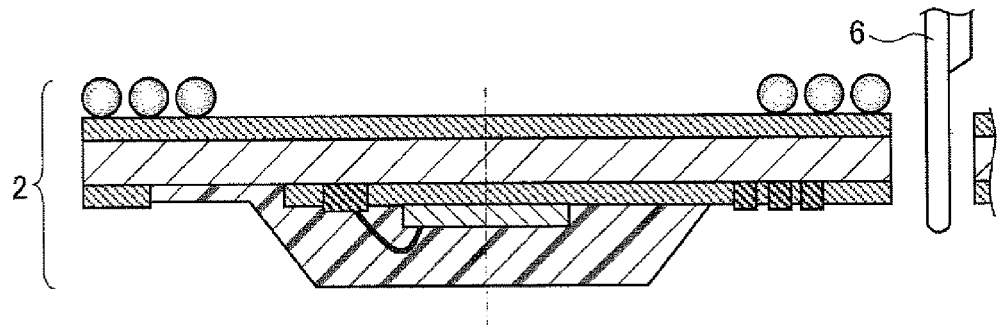
FIG. 7 is a sectional view showing a structure of the semiconductor apparatus of example Embodiment 1 during the process of cutting.

Then, as shown in FIG. 7, the batch substrate having been through the foregoing processes is diced with the dicing blade 6, whereby the lower package 2 is cut off and completed.

With the processes shown in FIGS. 3(a), 3(b), 3(c) to FIG. 7, the lower package 2 is produced without causing the thin resin film 5 to cover the stacking pad 3, which is a cause of a defect in stacking.

Embodiment 2

Figure 2:
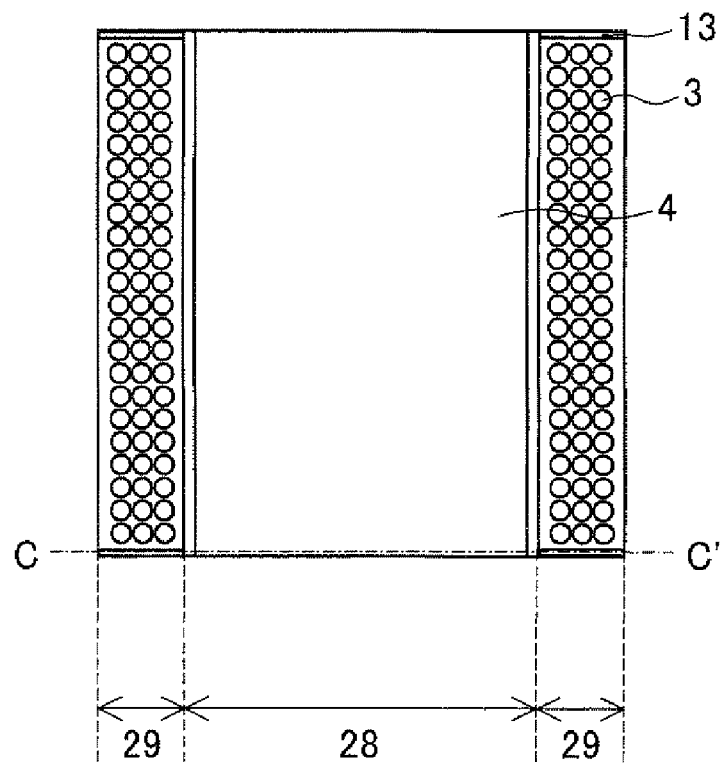
FIG. 2(a) is a plan view showing a structure of the semiconductor apparatus of an example Embodiment 2.
FIG. 2(b) is a sectional view showing the structure of the semiconductor apparatus of example Embodiment 2.
Figure 2:
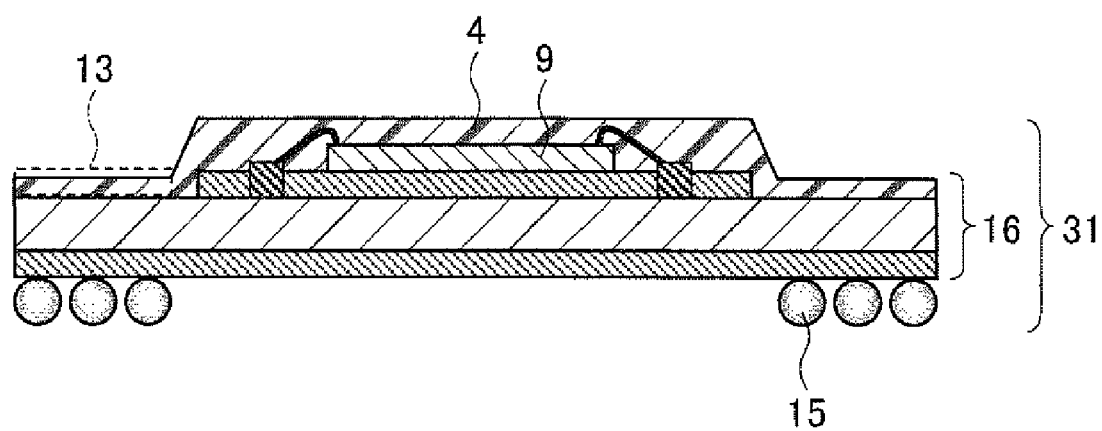

FIG. 2(a) is a plan view showing a structure of a semiconductor apparatus package of example Embodiment 2. FIG. 2(b) is a sectional view taken along C-C' indicated in FIG. 2(a).

The semiconductor apparatus package shown in the figures is a lower package 31 of a POP structure. The semiconductor apparatus includes a stacking pad 3 for stacking an upper semiconductor apparatus package.

A circuit board 16 of the semiconductor apparatus package is divided into three stripe zones. The central zone is a resin sealing section 28, where a semiconductor device is sealed with sealing resin 4. The stacking pad 3 is provided in each of exposed sections 29, which are besides the resin sealing section 28 and are exposed from the resin sealing section 28.

In those figures, at least one groove 13, which is to be partially filled with excess sealing resin 4 having seeped from the resin sealing section 28, is formed in a surface of the circuit board 16 outside of the resin sealing section 28, which surface is sealed with resin.

A part of the groove 13 formed in the substrate overlaps the outer edge of the package.

Normally, to produce a semiconductor apparatus package, plural pieces of semiconductor devices 9 are mounted on a batch substrate, and then the batch substrate is cut so as to be diced into individual pieces of semiconductor apparatuses.

Accordingly, the outer edge of the semiconductor apparatus package thus diced corresponds to the cutting line of the batch substrate.

The groove 13 shown in FIG. 2(a) is thus formed on the cutting line for cutting the batch substrate.

The sealing resin 4 having seeped from the resin sealing section 28 flows into the groove 13. With the groove 13, this excess sealing resin 4 is prevented from entering the exposed section 29 and forming the thin resin film 5 to cover the stacking pad 3. Further, the groove 13 is formed on the cutting line so that no thin resin film 5 is formed on the remaining part of the cutting line other than those sections where the groove 13 is formed.

The groove 13 to be formed on the cutting line is not particularly limited, but it is preferable that a part of the groove 13 be contiguous to the resin sealing section 28 or extend to the inside of the resin sealing section 28.

Further, the number of the groove 13 to be formed is not particularly limited, but it is preferable that the groove 13 be formed at every spot on the cutting line, at which spot the thin resin film 5 may be formed.

The spot where the thin resin film 5 may be formed on the cutting line is a spot where the sealing-resin edge overlaps the cutting line.

In FIG. 2(a), four grooves 13 are formed along the outer edge of the package. The grooves 13 each border on the spot where the thin resin film 5 may be formed, and where the cutting line overlaps the sealing-resin edge.

The following describes in detail the configuration of the groove 13, with reference to FIGS. 8(a), 8(b), and 8(c).

FIG. 8(a) is a plan view of the circuit board 16 constituted of the batch substrate, taken from a side on which the semiconductor device 9 (see FIG. 2) is to be mounted. FIG. 8(b) is a sectional view of the circuit board 16 taken along C-C'.

FIG. 8(c) is a sectional view showing an enlarged view of FIG. 8(b).

As shown in FIG. 8(a), the stacking pad 3 and the groove 13 are formed on the surface of the circuit board 16, on which surface the semiconductor device 9 (see FIG. 2) is to be mounted.

Further, as shown in FIG. 8(c), the surface (resin scaling surface) of the circuit board 16, on which surface the semiconductor device 9 is to be mounted, is a first surface 10 of the circuit board 16, and a surface of the circuit board 16, on which surface the bump 15 for external connection (see FIG. 2) is to be mounted, is a second surface 11 of the circuit board 16. A film of solder resist 12 is formed on each of the surfaces 10 and 11 of the circuit board 16 to serve as insulating layers. The groove 13 is formed in the first surface 10, on which the semiconductor device 9 is to be mounted.

The groove 13 is formed by making an opening in the solder resist 12 on the first surface 10 of the circuit board 16 in such a manner that the front surface of the circuit board 16 is exposed.

The following describes an exemplary production method to realize the semiconductor apparatus package shown in FIGS. 2(a) and 2(b), with reference to FIGS. 8(a), 8(b), 8(c) to FIG. 13.

Plural semiconductor devices 9 (see FIG. 2) are mountable on the circuit board 16 shown in FIG. 8(a). Plural semiconductor apparatuses 9 (see FIG. 2) are formed on the batch substrate, and then the batch substrate is cut so as to be diced into individual pieces of semiconductor apparatuses, whereby plural pieces of semiconductor apparatus packages are produced.

The opening is formed in the solder resist 12 by the following process of photolithography.

In the process of photolithography for forming the film of the solder resist 12 on the circuit board 16, the solder resist 12, which is photosensitive material, is applied all over the front surface of the circuit board 16, a mask is placed on the stacking pad 3 and on the connecting pad 30 (a pad that is provided on the circuit board 16 to electrically connect the semiconductor apparatus 9 and the thin metal wire 14), and then light is applied to the circuit board 16. The stacking pad 3 and the connecting pad 30 correspond to the electrical connection section defined in the Claims.

Thereafter, the solder resist 12 in the section covered by the mask is eliminated in the process of development. As a result, the opening is formed in the solder resist 12 at the sections where the connecting pad 30 and the stacking pad 3 are to be formed, so that no film of the solder resist 12 is formed in the sections.

The solder resist 12 applied to the section where the groove 13 is to be formed is eliminated concurrently with eliminating, in the photolithography, the solder resist 12 applied to the sections where the connecting pad 30 and the stacking pad 3 are to be formed.

Thus, no film of the solder resist 12 is formed in the section where the groove 13 is to be formed. As a result, the groove 13 is formed in the circuit board 16.

Accordingly, it is possible to form the groove 13 concurrently with eliminating, in the photolithography, the solder resist 12 applied to the connecting pad 30 and to the stacking pad 3. Therefore, neither the number of production processes nor the amount of production costs increases.

Figure 8:
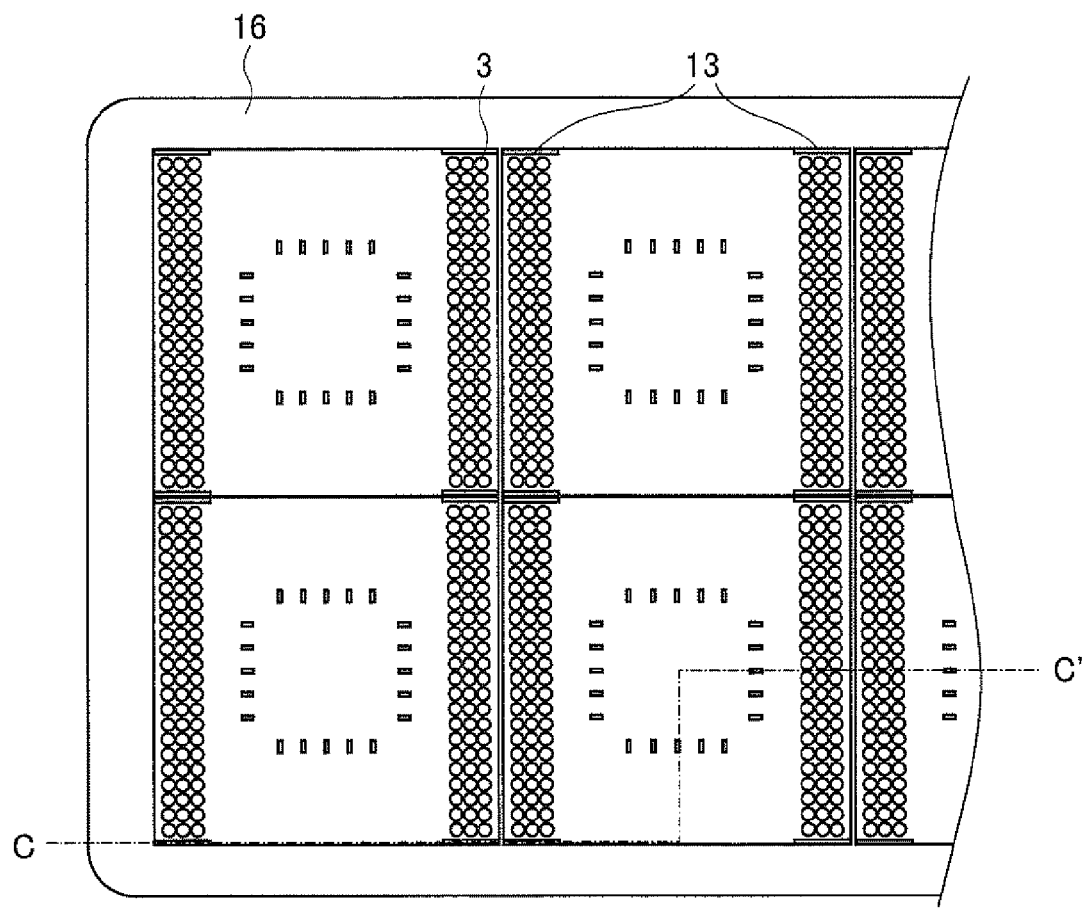
FIG. 8(*b*) is a sectional view showing the circuit board constituting the semiconductor apparatus of example Embodiment 2.
Figure 8:
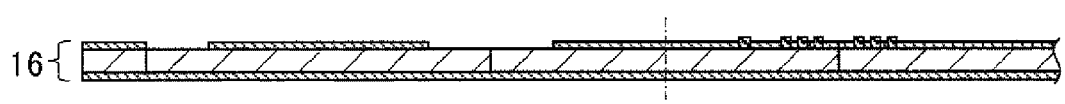
Figure 8:
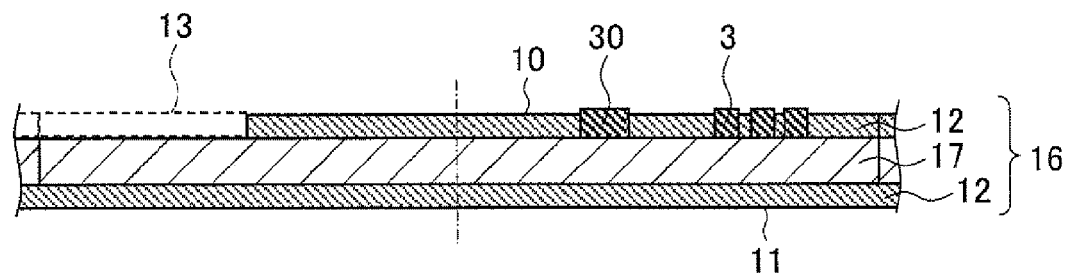
Figure 9:
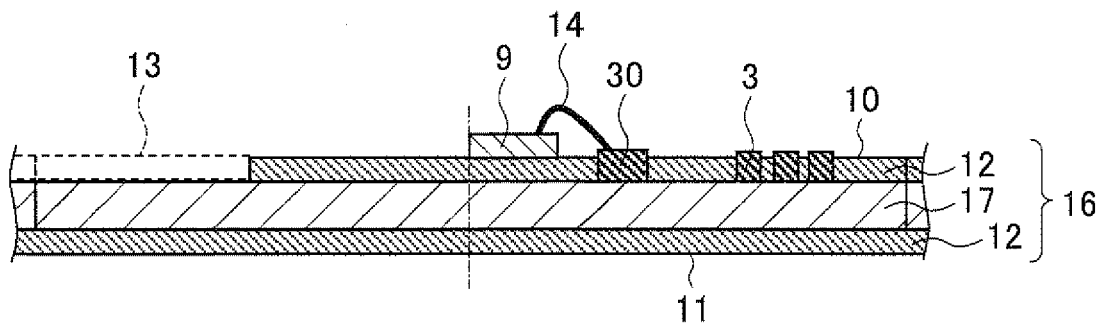
FIG. 9 is a sectional view showing a structure of the semiconductor apparatus of example Embodiment 2 during a production process.

The groove 13 is formed in the circuit board 16 in such a manner that at least a part of the groove 13 is contiguous to the cutting line of the circuit board 16 that is exposed, i.e. the cutting line of the semiconductor apparatus package that is to be diced (in FIG. 8, the groove 13 and the cutting line partially coincide). Thereafter, as shown in FIG. 9, the semiconductor device 9 is mounted on the circuit board 16, and an electrode of the semiconductor device 9 and the connecting pad 30 of the circuit board 16 are connected by the thin metal wire 14.

The method of connecting the electrode of the semiconductor device 9 and the connecting pad 30 of the circuit board 16 is not limited to the foregoing method above. As shown in FIG. 18, flip-chip bonding may be employed in which a bump mounted on the semiconductor device 9 and a corresponding land of the substrate are bonded without using a thin metal wire.

Figure 10:
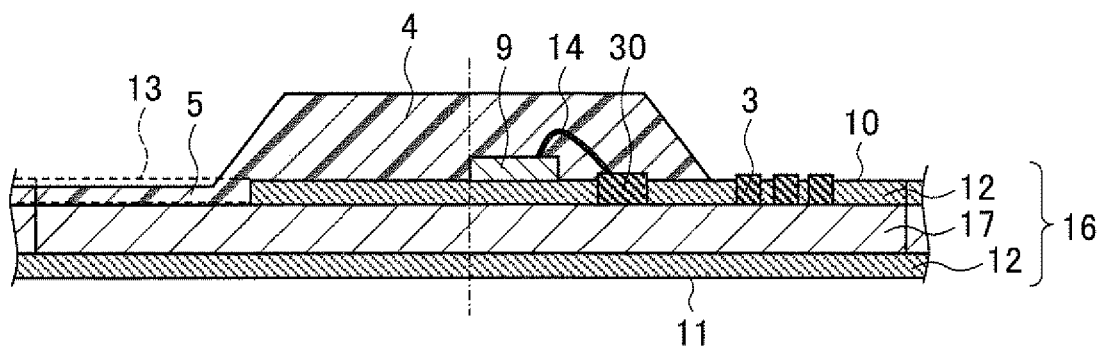
FIG. 10 is a sectional view showing a structure of the semiconductor apparatus of example Embodiment 2 during a following production process.

Then, the semiconductor apparatus 9 is sealed with the sealing resin 4, as shown in FIG. 10.

The semiconductor device 9 is sealed with resin by, for example, transfer molding with the use of a mold of a side gate design.

The resin sealing section 28 (see FIG. 2) is arranged so as not to cover the stacking pad 3.

As shown in this figure, the sealing resin 4 having seeped from the resin sealing section 28 at the time of sealing with resin flows into the groove 13. This prevents the spread of the thin resin film 5 to the stacking pad 3, and therefore stacking properties of the POP structure are not deteriorated.

Figure 11:
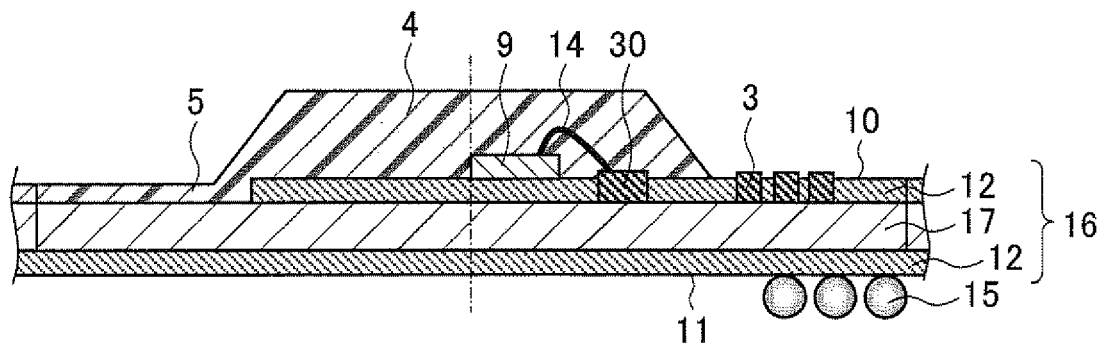
FIG. 11 is a sectional view showing a structure of the semiconductor apparatus of example Embodiment 2 during a following production process.

Then, as shown in FIG. 11, the bump 15 is formed on a pad (not illustrated) for external terminals, which pad is formed on the second surface 11 of the circuit board 16.

The bump 15 is electrically connected to the electrode of the semiconductor apparatus 9 mounted on the first surface 10 of the circuit board.

Figure 12:
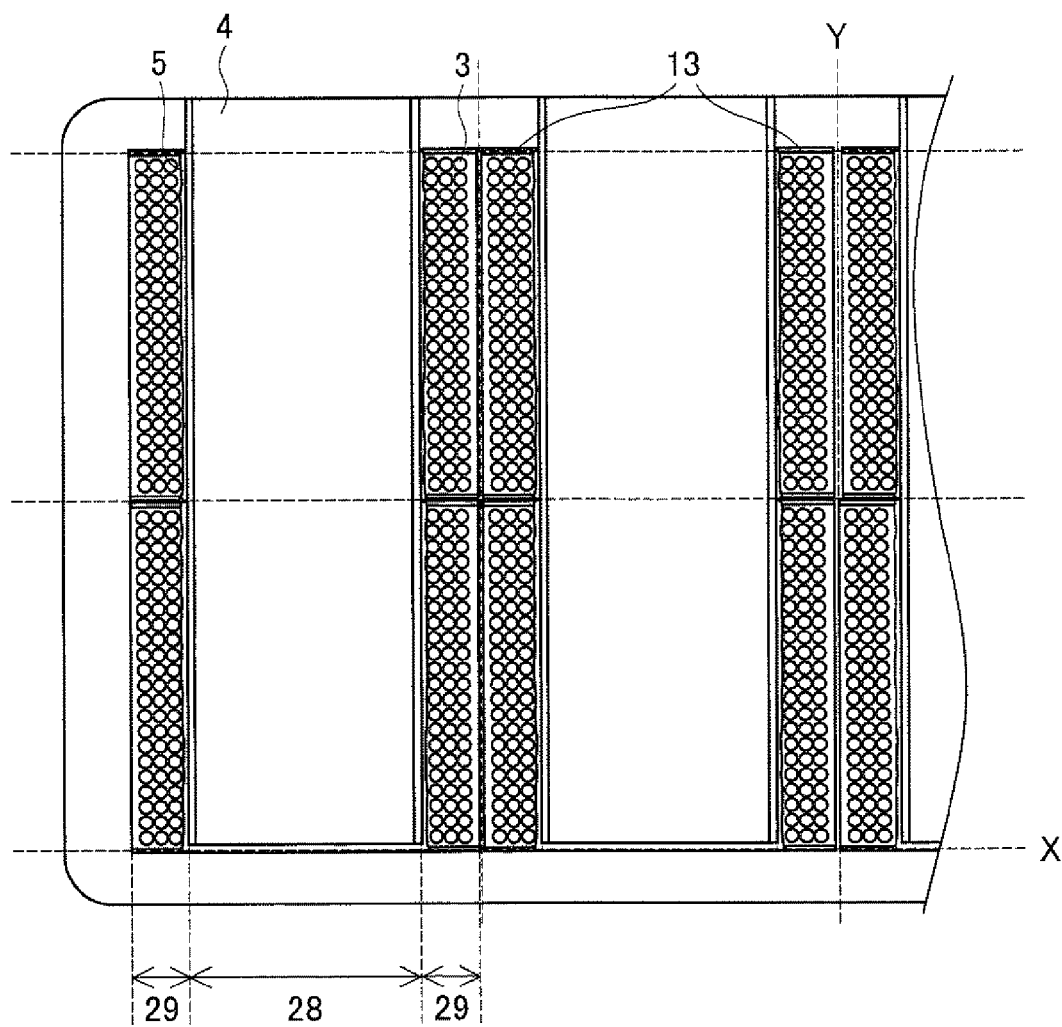
FIG. 12 is a plan view showing a structure of the semiconductor apparatus of example Embodiment 2.
Figure 13:
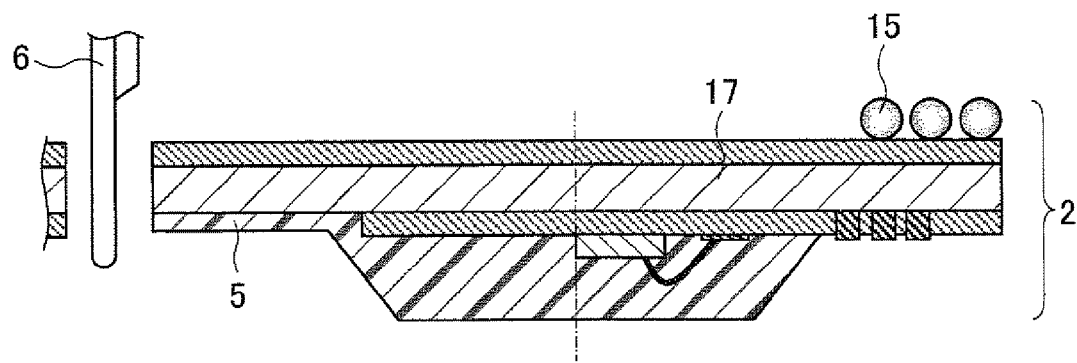
FIG. 13 is a sectional view showing a structure of the semiconductor apparatus of example Embodiment 2 during the process of cutting.

Then, the batch substrate shown in FIG. 12 is turned upside down, and, as shown in FIG. 13, is cut by a dicing blade 6 so as to be diced, whereby the lower package 31 is cut off and completed.

The circuit board 16, the resin sealing section 28 (see FIG. 2), and the circuit board 16 having the groove 13 filled with the sealing resin 4 that has seeped need to be cut along direction X (direction along which the resin sealing section 28 and the exposed section 29 are arranged), indicated in FIG. 12, by the dicing with the dicing blade 6.

As shown in FIG. 13, the groove 13 on the cutting line is formed in the circuit board 16 by making an opening in the solder resist 12. Thus, the thin resin film 5 having seeped from the sealing-resin edge and filling the groove 13 comes into direct contact with the base material 17 of the circuit board 16.

In the present embodiment, the base material 17 of the circuit board is a glass cloth substrate impregnated with resin, the sealing resin 4 to seal the semiconductor device is molding resin, whose main component is epoxy, for transfer molding, and the solder resist 12 is made of resin containing epoxy as a main material.

The types of the base material 17, the sealing resin 4, and the solder resist 12 are not limited to those mentioned above.

The adhesive force between the base material 17 of the circuit board and the thin resin film 5 is greater than that between the solder resist 12 and the thin resin film 5.

Thus, the thin resin film 5 in the groove 13 is less likely to peel off from the substrate at the time of cutting. Therefore, adhesion of shreds to the outer edge of the package and to the dicing blade 6 is prevented.

Embodiment 3

Figure 14:
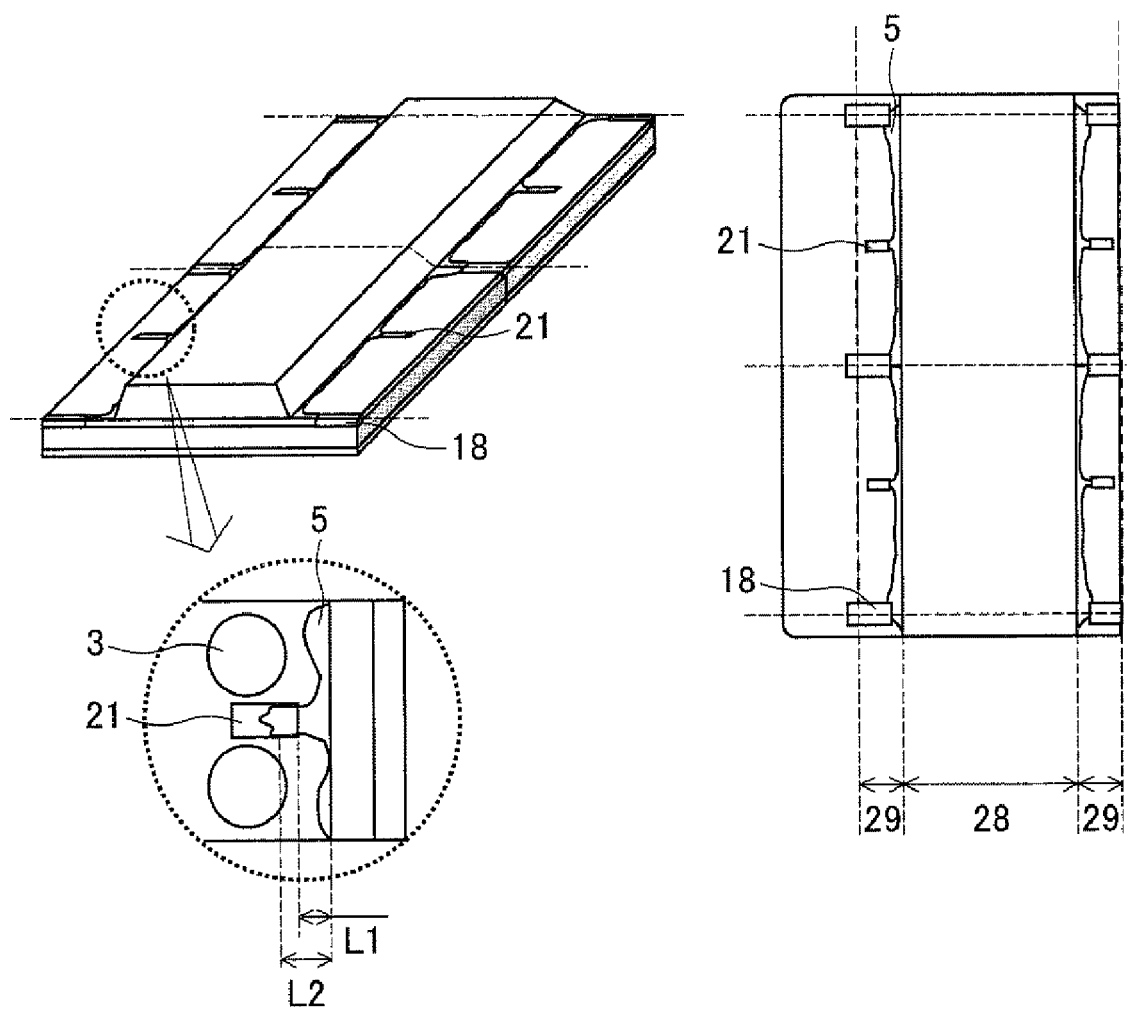
FIG. 14 is a set of a perspective view and a plan view showing a example structure of a semiconductor apparatus of example Embodiment 3.
Figure 15:
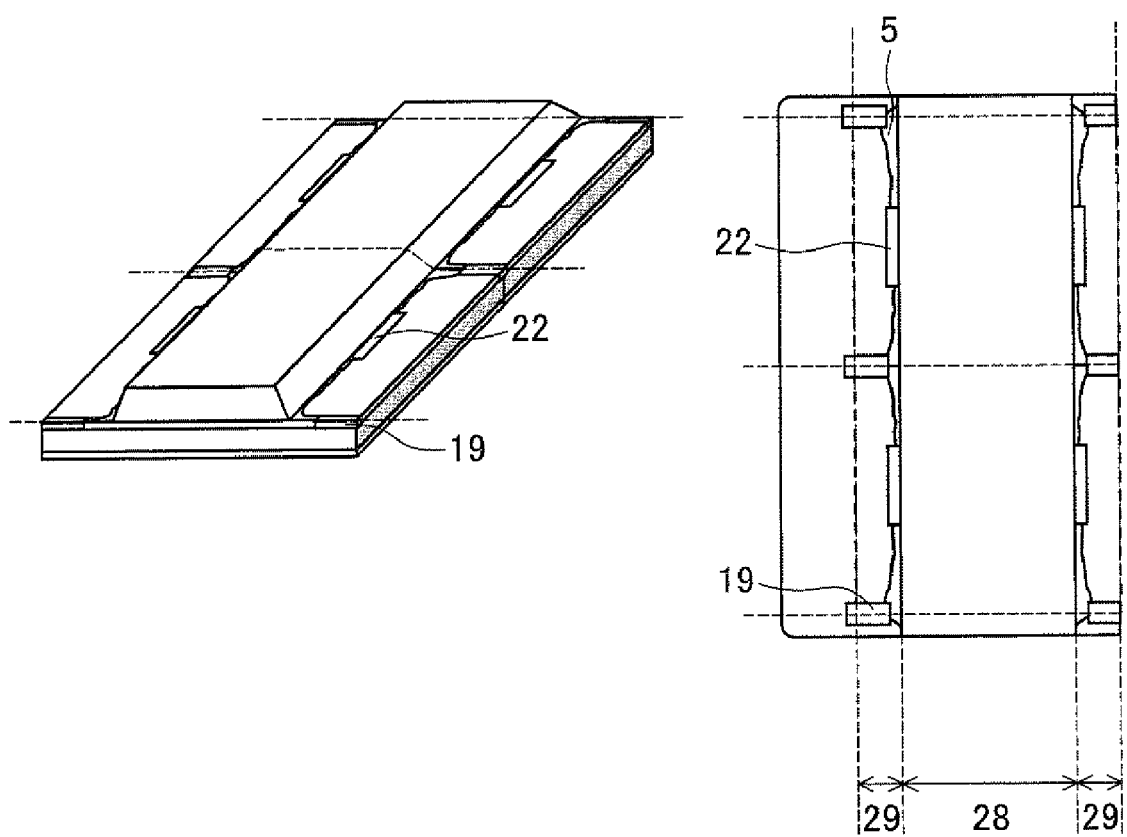
FIG. 15 is a set of a perspective view and a plan view showing an example structure of the semiconductor apparatus of example Embodiment 3.

FIGS. 14 to 16 illustrate a structure of a semiconductor apparatus package in accordance with example Embodiment 3, showing a positional relationship between a sealing-resin edge and a groove 13 formed by making an opening in solder resist 12.

In FIG. 14, two types of grooves to be filled with sealing resin 4 having seeped from an edge of a mold are formed: a groove 18 formed on the cutting line; and a groove 21 formed in between stacking pads 3.

In FIG. 14, the groove 21 is formed in between the stacking pads 3 and at a distance of L1 from the sealing-resin edge.

The distance L1 to the edge of the groove 21 needs to be set in such a manner that the thin resin film 5 having seeped from a section pressed by a mold for transfer molding is prevented from spreading from the sealing-resin edge to the circuit board 8 exposed from the resin sealing section 28 including the stacking pad 3, and reaching the stacking pad 3.

Thus, L1 (distance between the sealing-resin edge and an edge of the groove 21) is shorter than L2 (distance between the sealing-resin edge and an edge of the stacking pad 3).

In FIG. 14, one groove 21 is formed at the center of the sealing-resin edge bordering on the exposed section 29 including the stacking pad 3. The configuration of the groove 21, however, is not limited to the foregoing configuration, and a plurality of grooves 21 may be formed.

In the same manner as the groove 21, the groove 18 in FIG. 14 is formed on the cutting line at a distance of L1 from the sealing-resin edge.

Further, the groove 18 and the groove 21 are to be filled with the thin resin film 5, but the groove 18 and the groove 21 are not necessarily have to be filled completely, and may be filled with the thin resin film 5 partially as shown in the enlarged view in FIG. 14.

The following are advantages of forming the groove 18 and the groove 21 at the distance of L1 from the sealing-resin edge.

The grooves 18 and 21 are formed at the distance of L1 from the sealing-resin edge so that the grooves do not border on the resin sealing section Thus, when the sealing with resin is carried out, there is no protrusion, depression, or space between the mold and the substrate that is in contact with the mold. This produces an advantage that the sealing resin does not easily seep from the sealing-resin edge, compared with a case in which the grooves border on the resin sealing section 28.

Further, the groove 18 is formed on a section that becomes an outer edge of the semiconductor apparatus package as a result of dicing with the dicing blade 6. In other words, the groove 18 is formed on the cutting line.

For example, if the groove is to be formed by making an opening in the solder resist 12, the thin resin film 5 of the sealing resin 4 having seeped from the edge of the resin sealing section and filling the groove 18 comes into direct contact with the base material 17 of the circuit board 16.

If the base material 17 of the circuit board is a glass cloth substrate impregnated with resin, which substrate is commonly used, the adhesive force between the base material 17 of the circuit board and the thin resin film 5 is greater than that between the solder resist 12 and the thin resin film 5.

Thus, the thin resin film 5 of resin filling the groove 18 does not peel off at the time of cutting. Therefore, adhesion of shreds to the outer edge of the package and to the dicing blade 6 is prevented.

The foregoing grooves are formed by making an opening in the solder resist 12 in the process of photolithography, for example. Materials and processes are not limited. Other insulating materials or base substrates may be processed with laser or the like to form the grooves.

FIGS. 15 and 16 (stacking pad is not illustrated in these figures) each show a semiconductor apparatus package in which a part of the groove, to be filled with the sealing resin 4 having seeped from the sealing-resin edge, is formed along the sealing-resin edge bordering on the exposed section 29 including the stacking pad.

FIG. 15 shows a groove 22 formed in such a manner that the edge of the groove substantially overlaps and is contiguous to the sealing-resin edge. FIG. 16 shows a groove 23, a part of which extends to the inside of the sealing-resin edge.

The groove 22 and the groove 23 are formed along the sealing-resin edge of the package. The grooves 22 and 23, however, are not to limit the length of the grooves or the number of the grooves to be formed.

The groove 19 is formed in such a manner that the edge of the groove substantially overlaps the sealing-resin edge. The groove 20 is formed in such a manner that a part of the groove extends to the inside of the sealing-resin edge. The grooves 19 and 20 are formed at the sections that become the outer edges of the semiconductor apparatus package as a result of the dicing.

An advantage of the groove 22 and the groove 23 is that it becomes possible to form the grooves to be filled with the sealing resin 4 having seeped, even if it is not possible to form the grooves in between the stacking pads owing to a narrow space between the stacking pads, or even if the distance of L2 (distance between the sealing-resin edge and an edge of the stacking pad) is so narrow that it is not possible to form the grooves at the distance of L1 from the sealing-resin edge.

Embodiment 4

Figure 17:
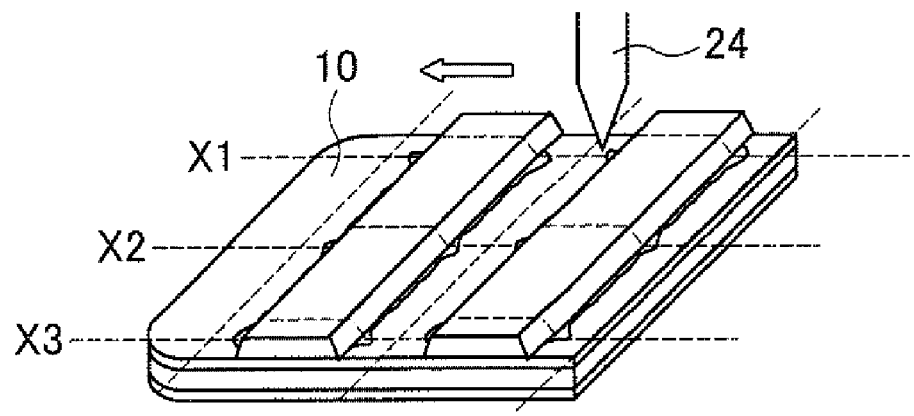
FIG. 17(*a*) is a perspective view showing an example structure of a semiconductor apparatus of example Embodiment 4.
Figure 17:
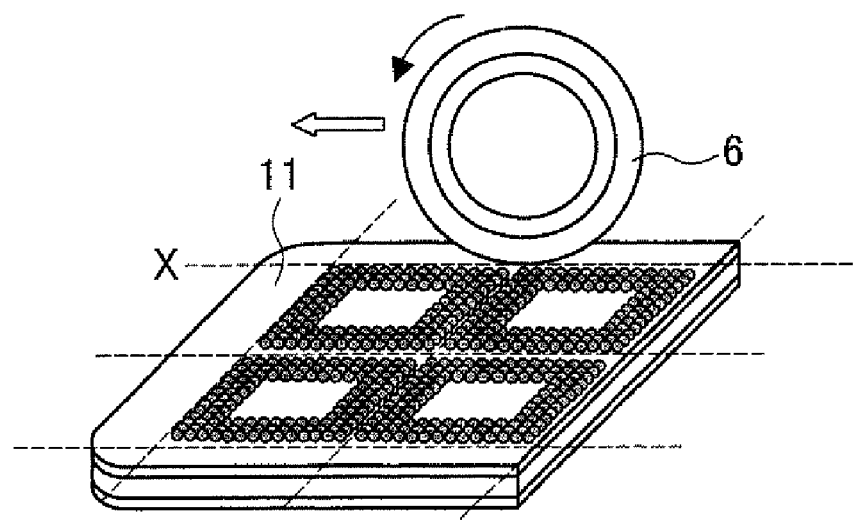

FIGS. 17(a) and 17(b) show a method of producing a semiconductor apparatus package in accordance with example Embodiment 4 of the technology disclosed herein.

At least plural semiconductor apparatuses are mountable on a circuit board. The circuit board and resin sealing sections are cut at the end so as to be diced into individual pieces of semiconductor apparatus packages.

In this production method, it is common to dice the circuit board from the second surface 11 with the use of the dicing blade 6, as shown in FIG. 17(b).

If, as shown in FIG. 17(a), a first surface 10 of the circuit board has a protrusion and a depression that are formed by the sealing resin and the circuit board, and if, as also shown in FIG. 17(a), the semiconductor apparatus package after the dicing has a structure in which the circuit board is divided into three stripes, with the central region being the resin sealing section and the side regions being regions of the circuit board exposed from a resin sealing section (regardless of presence of a stacking pad 3), then the circuit board and the resin sealing section need to be cut along direction X at the time of cutting. This direction X is a direction in which the resin sealing section is to be cut.

Figure 23:
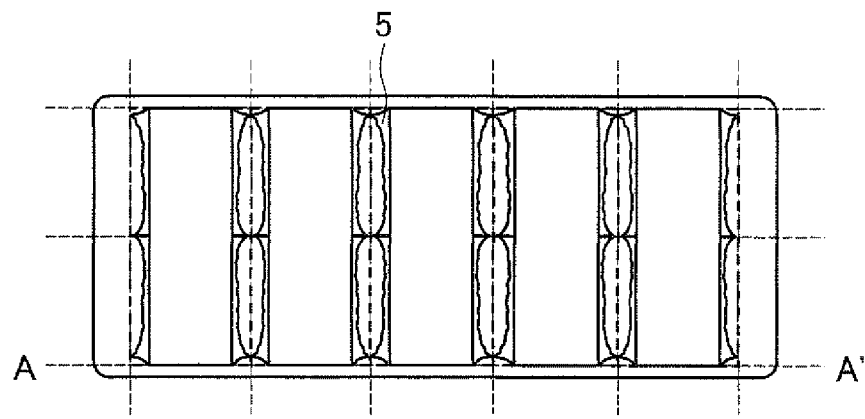
FIG. 23 is a set of a plan view, a perspective view, and a sectional view showing a structure of a semiconductor apparatus of a conventional technique, showing how a shred is produced.
Figure 23:
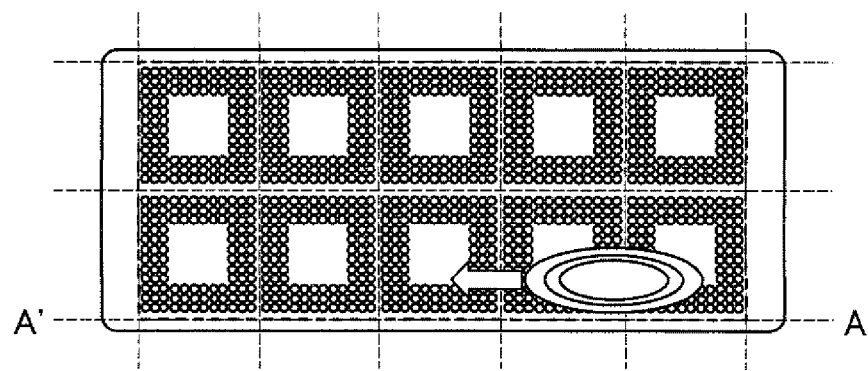
Figure 23:
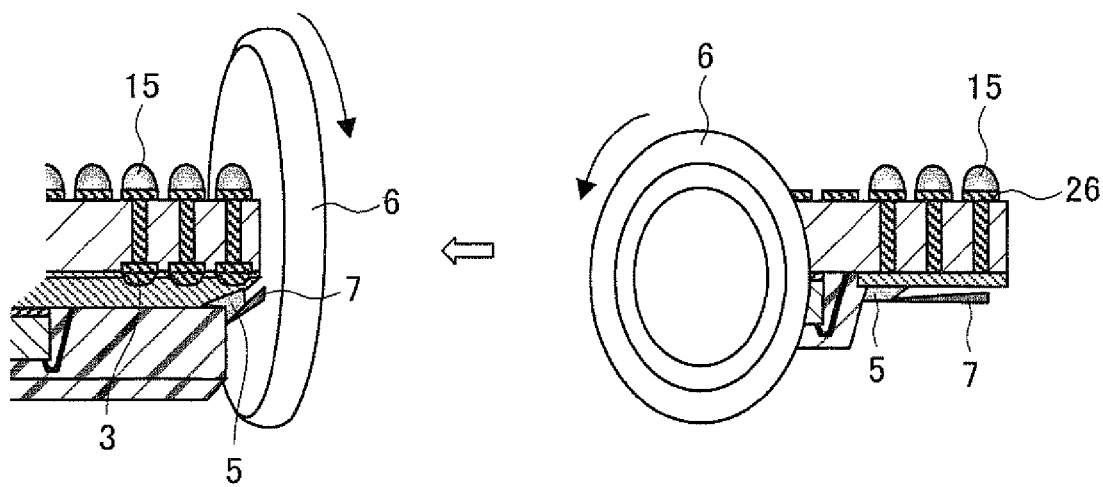
Figure 24:
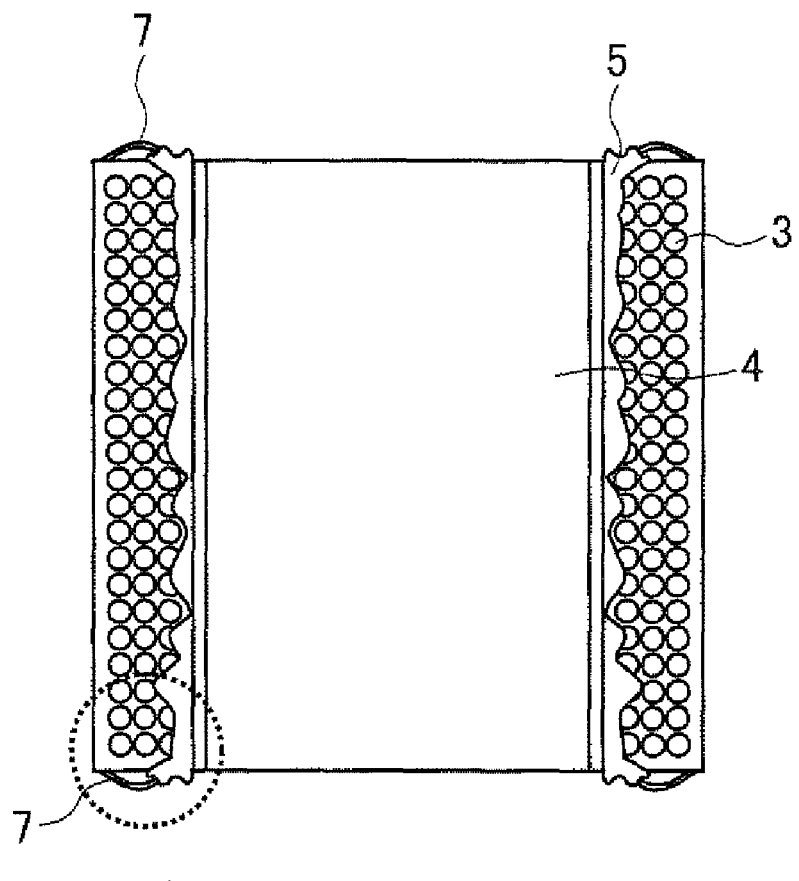
FIG. 24 is a plan view showing a shred adhering to an outer edge of a semiconductor apparatus package of a conventional technique.
Figure 24:
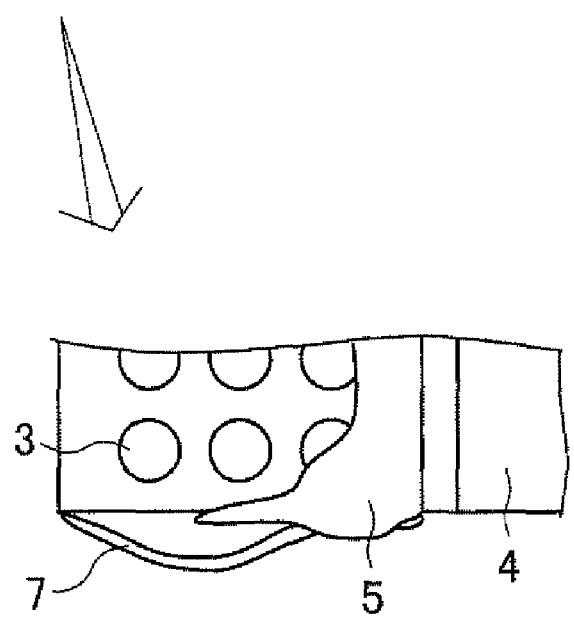

If the circuit board is cut while the thin resin film 5 of resin having seeped from the sealing-resin edge is on the cutting line, a shred 7 (see FIG. 23) of the solder resist 12 or the like adheres to the outer edge of the semiconductor apparatus package and to the dicing blade 6.

The shred 7 (see FIG. 23) is formed as follows. Owing to weak adhesion between the thin resin film 5 and the solder resist 12 formed on the front surface of the circuit board, the thin resin film 5 falls to the resin sealing surface. This makes it impossible to cut the thin resin film 5, and the thin resin film 5 adheres to the outer edge of the package.

Thus, as shown in FIG. 17(a), laser 24 is applied only in direction X (circuit board→resin sealing section→circuit board), along lines X1, X2, and X3, to cut a slit in the thin resin film 5 on the cutting line.

This process is carried out prior to the dicing with the dicing blade 6 as shown in FIG. 17(b). Thus, adhesion of the thin resin film 5 to the outer edge of the package is prevented. Further, adhesion of the shred 7 to the outer edge of the package and to the dicing blade 6 is also prevented.

Neither new production method nor an additional special process is necessary if this laser process is to be carried out concurrently with sealing the semiconductor apparatus with resin, for example concurrently with a laser marking process in which product numbers or the like are marked on the resin sealing section by laser, following the process of transfer molding.

It is possible to add the foregoing laser process to the method, described in example Embodiments 1 to 3, of producing the semiconductor apparatus package with the use of the circuit board having the groove. This is more effective in view of shred prevention.

The present invention is not limited to the description of the embodiments above, but may be altered by a skilled person within the scope of the claims. An embodiment based on a proper combination of technical means disclosed in different embodiments is encompassed in the technical scope of the present invention.

The method of producing the semiconductor apparatus package may be arranged as follows.

(Method 1)

The method of producing the semiconductor apparatus package in which at least one semiconductor apparatus is mounted on a circuit board covered with sealing resin, and is to be diced, includes the steps of: mounting the semiconductor apparatus on a first surface of a circuit board; electrically connecting a connecting pad formed on the first surface of the circuit board and an electrode of the semiconductor apparatus; covering, with the sealing resin, the semiconductor apparatus mounted on the first surface of the circuit board; filling, with the sealing resin, a groove formed in the first surface of the circuit board, concurrently with the step of covering the semiconductor apparatus with the sealing resin; forming, on a second surface of the circuit board, a solder ball on a pad for an external terminal, which pad is electrically connected to the connecting pad on the first surface; and dicing the circuit board from the second surface, the step of dicing being carried out so as to cut at least a part of the groove filled with the sealing resin.

(Method 2)

The method of producing the semiconductor apparatus package in which at least one semiconductor apparatus is mounted on a circuit board, covered with sealing resin, and is to be diced, includes: mounting the semiconductor apparatus on a first surface of a circuit board; electrically connecting a connecting pad formed on the first surface of the circuit board and an electrode of the semiconductor apparatus; covering, with the sealing resin, the semiconductor apparatus mounted on the first surface of the circuit board; eliminating, with the use of laser, a thin resin film formed on a sealing-resin edge of the first surface of the circuit board; forming, on a second surface of the circuit board, a solder ball on a pad for an external terminal, which pad is electrically connected to the connecting pad on the first surface; and dicing the circuit board from the second surface.

The semiconductor apparatus package has the groove, at least a part of which is filled with the excess sealing resin, outside of the resin sealing section so that, when the semiconductor device is sealed with resin, sealing resin that has seeped flows into the groove.

Thus, the circuit board exposed from the resin sealing section is not covered by the thin resin film so that poor electrical connection due to the thin resin film is prevented.

Further, with the method of producing the semiconductor apparatus package in accordance with example embodiments, the groove is formed by making an opening in the insulating layer formed on the circuit board. Thus, it is possible to form the groove concurrently with forming the insulating layer on the circuit board in the photolithography. Therefore, it is unnecessary to include an additional process of forming the groove.

Accordingly, with the semiconductor apparatus package and the production method thereof in accordance with example embodiments, poor electrical connection due to the thin resin film is prevented without an additional process. This is an advantage.

With example embodiments of the technology disclosed herein, the sealing resin having seeped from the resin sealing section is prevented from spreading onto the circuit board exposed from the resin sealing section of the semiconductor device. The technology disclosed herein is applicable to stacked semiconductor package, such as POP.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

As described above, the semiconductor apparatus package of example embodiments of the technology disclosed herein includes a circuit board, at least a part of which is exposed from a resin sealing section, and a semiconductor device sealed with resin, the semiconductor apparatus package having at least one groove in a section of a resin sealing surface of the circuit board, which section is outside of the resin sealing section, said at least one groove being at least partially filled with excess sealing resin having seeped from the resin sealing section.

With this structure, the sealing resin having seeped from the resin sealing section flows into the groove. Thus, the circuit board exposed from the resin sealing section is prevented from being covered by the sealing resin that has seeped.

Therefore, the sealing resin having seeped does not become the thin resin film to cover the circuit board exposed from the resin sealing section. Thus, poor electrical connection is prevented with the use of the circuit board. This is an advantage.

If this advantage of preventing poor electrical connection with the use of the circuit board is applied to a POP structure, resin is prevented from entering a region where a land is provided for stacking a semiconductor apparatus package, whereby formation of a thin resin film is prevented. Thus, defects in a stack of the upper semiconductor apparatus package and the lower semiconductor apparatus package are prevented. This is an advantage.

At least a part of the groove is contiguous to a sealing-resin edge, which is a boundary between the resin sealing section and the circuit board exposed from the resin sealing section.

If at least a part of the groove is contiguous to the sealing-resin edge, it implies that the part of the groove is at least in contact with the resin sealing section. Therefore, excess sealing resin having seeped from the resin sealing section immediately falls into the groove. Thus, the excess sealing resin flows into the groove more easily and therefore is prevented more efficiently from covering the circuit board exposed.

Further, a part of the groove may extend beyond a sealing-resin edge, which is a boundary between the resin sealing section and the circuit board exposed from the resin sealing section, and into the resin sealing section.

With this structure, in the same manner as the foregoing, the excess sealing resin that has seeped flows into the groove more easily and assuredly. Thus, the advantageous effect of preventing the excess sealing resin from covering the circuit board that is exposed improves.

Further, it is preferable that the groove be formed by making an opening in an insulating layer that is on a front surface of the circuit board, which front surface is the resin sealing surface.

With this structure, the opening is made in the insulating layer. As a result, there is formed a difference in level, by the thickness of the insulating layer, between a region where the insulating layer is formed and a region where the insulating layer is not formed.

By taking an advantage of the difference, it is possible to form the groove to be filled with the excess sealing resin that has seeped. Further, the insulating layer is a component that becomes necessary normally in the process of forming the circuit board. Therefore, no special structure is necessary to form the groove, and an existing structure can be employed.

Further, it is preferable that the groove be formed by making the opening in the insulating layer so as to expose the front surface of the circuit board, and at least a part of the groove overlaps a cutting line of the circuit board exposed from the resin scaling section.

With this structure, the sealing resin flowed into the groove comes into direct contact, at a bottom section of the groove, with the front surface of the circuit board exposed. In this case, adhesive force between the base material of the circuit board and the sealing resin is superior to that between the material constituting the insulating layer and the sealing resin. Thus, the thin resin film formed of the sealing resin that has seeped does not easily peel off from the circuit board.

Furthermore, at least a part of the groove overlaps the cutting line of the circuit board exposed from the resin sealing section. Thus, as described earlier, even if the circuit board is cut along the cutting line, the thin resin film keeps adhering to the front surface of the circuit board. Thus, the problems due to weak adhesive force between the insulating layer and the thin resin film are prevented. Specifically, the following problems are prevented: as a result of the cutting, the thin resin film peels off and falls onto the surface sealed with resin, making it impossible to cut the thin resin film and causing the thin resin film to adhere to the outer edge of the package; and shreds of the insulating layer or the like adhere to the outer edge of the semiconductor apparatus package and to the dicing blade, resulting from the thin resin film adhering to the outer edge of the package. This produces an advantage that the risk of poor electrical connection in the semiconductor apparatus package is reduced.

The larger the section where the cutting line and the groove overlap is, the more effectively the problem of the adhering of the thin resin film that is not cut off is prevented.

What is claimed is:

1. A semiconductor apparatus package, comprising a circuit board, at least a part of which is exposed from a resin sealing section, and a semiconductor device sealed with resin, the semiconductor apparatus package comprising at least one groove in a section of a resin sealing surface of the circuit board, which section is outside of the resin sealing section, said at least one groove being at least partially filled with excess sealing resin having seeped from the resin sealing section; and at least a part of the groove overlaps a cutting line of the circuit board exposed from the resin sealing section.

2. The semiconductor apparatus package of claim 1, wherein at least a part of the groove is contiguous to a sealing-resin edge, which is a boundary between the resin sealing section and the circuit board exposed from the resin sealing section.

3. The semiconductor apparatus package of claim 1, wherein a part of the groove extends beyond a sealing-resin edge, which is a boundary between the resin sealing section and the circuit board exposed from the resin sealing section, and into the resin sealing section.

4. The semiconductor apparatus package of claim 1, wherein the groove is formed by making an opening in an insulating layer that is on a front surface of the circuit board, which front surface is the resin sealing surface.

5. The semiconductor apparatus package of claim 4, wherein the groove is formed by making the opening in the insulating layer so as to expose the front surface of the circuit board, and at least a part of the groove overlaps a cutting line of the circuit board exposed from the resin sealing section.

6. A method of producing a semiconductor apparatus package including: a circuit board, at least a part of which is exposed from a resin sealing section, including an electrical connection section; and a semiconductor device sealed with resin, the method comprising the step of forming a groove, which is at least partially filled with excess sealing resin having seeped from the resin sealing section, by making an opening in an insulating layer formed on the circuit board, the step of forming the groove being carried out concurrently with the step of eliminating, in photolithography for forming the insulating layer on the circuit board, the insulating layer that is on the electrical connection section.

7. A method of producing a semiconductor apparatus package including a circuit board, at least a part of which is exposed from a resin sealing section, and a semiconductor device sealed with resin, the method comprising the steps of:

forming plural pieces of the semiconductor apparatus packages by use of a batch substrate;

cutting the batch substrate to divide the plural pieces of the semiconductor apparatus packages into individual semiconductor apparatus packages;

forming the groove, into which excess sealing resin having seeped from the resin sealing section is to flow, by making an opening in an insulating layer, which covers a front surface of the circuit board, to expose the front surface of the circuit board, the groove being formed in such a manner that at least a part of the groove overlaps a cutting line of the batch substrate and is formed at a spot on the cutting line, to which spot the excess sealing resin flows; and cutting the batch substrate along the cutting line.

8. A method of producing a semiconductor apparatus package including a circuit board, at least a part of which is exposed from a resin sealing section, and a semiconductor device sealed with resin, the method comprising the steps of:

forming plural pieces of the semiconductor apparatus packages by use of a batch substrate;

cutting the batch substrate to divide the plural pieces of the semiconductor apparatus packages into individual semiconductor apparatus packages;

forming at least one groove, into which excess sealing resin having seeped from the resin sealing section is to flow, in a section of a resin sealing surface of the circuit board, which section is outside of the resin sealing section; and cutting, prior to the step of cutting the batch substrate, excess sealing resin having seeped from the resin sealing section onto the cutting line, along the cutting line by use of laser.

9. The semiconductor apparatus package of claim 1, further comprising:

an electrical connection section provided on the outside section of the resin sealing surface of the circuit board; and an external terminal provided on a surface of the circuit board opposed to the resin sealing surface.

10. The semiconductor apparatus package of claim 1, wherein plural grooves are provided in the section of the circuit board which is outside the resin sealing section, and wherein at least on one side of the resin sealing section the plural grooves are equally spaced.

11. The semiconductor apparatus package of claim 1, wherein the circuit board comprises a base material having an insulation layer formed thereon, and wherein at least some of the excess resin is in contact with the base material whereby a greater adhesive force is experienced between the excess resin and the base material than between the resin and the insulation layer.

12. The method of claim 8, further comprising:

providing an electrical connection section outside of the resin sealing section on the resin sealing surface of the circuit board; and providing an external terminal on a surface of the circuit board opposed to the resin sealing surface.

13. The method of claim 8, further comprising providing, at least on one side of the resin sealing section, equally spaced plural grooves in the section of the circuit board which is outside the resin sealing.

14. The method of claim 8, wherein the circuit board comprises a base material having an insulation layer formed thereon, and wherein the method further comprises forming the at least one groove in the insulation layer so that at least some of the excess resin is in contact with the base material whereby a greater adhesive force is experienced between the excess resin and the base material than between the resin and the insulation layer.

15. A semiconductor apparatus package, comprising:

a circuit board, at least a part of which is exposed from a resin sealing section, including an electrical connection section;

a semiconductor device sealed with resin;

the semiconductor apparatus package comprising at least one groove in a section of a resin sealing surface of the circuit board, which section is outside of the resin sealing section, said at least one groove being at least partially filled with excess sealing resin having seeped from the resin sealing section so as to prevent the excess sealing resin from covering the electrical connection section.

16. The semiconductor apparatus package of claim 15, further comprising an external terminal provided on a surface of the circuit board opposed to the resin sealing surface.

17. A semiconductor apparatus package, comprising:

a circuit board comprising a base material, the base material having an insulation layer formed thereon, the circuit board comprising a resin sealing section and an outside section exposed from the resin sealing section; and a semiconductor device sealed with resin;

the semiconductor apparatus package comprising at least one groove provided in the insulation layer in the outside section of the circuit board;

said at least one groove being at least partially filled with excess sealing resin having seeped from the resin sealing section, at least some of the excess resin being in contact with the base material whereby a greater adhesive force is experienced between the excess resin and the base material than between the resin and the insulation layer.

18. The semiconductor apparatus package of claim 17, wherein where the excess resin is in the contact with the base material the excess resin has a difference in level than where the base material contacts the insulation layer outside the at least one groove.

* * * * *